US006804278B2

(12) United States Patent
Daiber et al.

(10) Patent No.: US 6,804,278 B2
(45) Date of Patent: Oct. 12, 2004

(54) EVALUATION AND ADJUSTMENT OF LASER LOSSES ACCORDING TO VOLTAGE ACROSS GAIN MEDIUM

(75) Inventors: Andrew Daiber, Palo Alto, CA (US); Hua Li, San Jose, CA (US); William B. Chapman, Sunnyvale, CA (US); Mark McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 09/900,426

(22) Filed: Jul. 6, 2001

(65) Prior Publication Data

US 2003/0012239 A1 Jan. 16, 2003

(51) Int. Cl.[7] .............................. H01S 3/00; H01S 3/13
(52) U.S. Cl. ................................ 372/38.01; 372/29.01
(58) Field of Search ............................ 372/20, 26, 29, 372/43–46, 92, 18, 38.01, 50, 31, 38.02, 32; 365/106

(56) References Cited

U.S. PATENT DOCUMENTS

| | | |
|---|---|---|
| 3,788,743 A | 1/1974 | George |
| 3,899,748 A | 8/1975 | Bodlaj |
| 3,921,099 A | 11/1975 | Abrams et al. |
| 3,965,440 A | 6/1976 | Graves |
| 3,967,211 A | 6/1976 | Itzkan et al. |
| 4,309,671 A | 1/1982 | Malyon |
| 4,410,992 A * | 10/1983 | Javan ........................... 372/32 |
| 4,460,977 A * | 7/1984 | Shimada et al. ............ 365/106 |
| 4,504,950 A | 3/1985 | AuYeung |
| 4,560,246 A | 12/1985 | Cotter |
| 4,583,227 A | 4/1986 | Kirkby |
| 4,730,105 A | 3/1988 | Mitschke et al. |
| 4,770,047 A | 9/1988 | Arditty et al. |
| 4,839,614 A | 6/1989 | Hill et al. |
| 4,843,233 A | 6/1989 | Jeunhomme |
| 4,847,854 A * | 7/1989 | Van Dijk ...................... 372/92 |
| 4,870,269 A | 9/1989 | Jeunhomme et al. |
| 4,932,782 A | 6/1990 | Graindorge et al. |
| 4,934,816 A | 6/1990 | Silver et al. |
| 4,994,677 A | 2/1991 | Graindorge |
| 5,022,745 A | 6/1991 | Zayhowski et al. |
| 5,028,395 A | 7/1991 | Sebille et al. |
| 5,058,124 A | 10/1991 | Cameron et al. |

(List continued on next page.)

FOREIGN PATENT DOCUMENTS

| | | |
|---|---|---|
| EP | 0924628 | 8/1998 |
| WO | WO 98/05105 | 2/1998 |
| WO | WO 98/44424 | 10/1998 |
| WO | WO 00/49689 | 8/2000 |
| WO | WO 01/04999 A1 | 1/2001 |
| WO | WO 02/078137 A1 | 10/2002 |
| WO | WO 03/005500 A2 | 1/2003 |
| WO | WO 03/005501 A2 | 1/2003 |
| WO | WO 03/005512 A2 | 1/2003 |

OTHER PUBLICATIONS

Shtengel, G E et al.: "Internal Optical Loss Measurements in 1.3μm InGaAsP Laser", Electronics Letters, IEE Stevenage, GB, vol. 31, No. 14, Jul. 6, 1995.
Ketelsen, L.J.P.; "Simple Technique For Measuring Cavity Loss in Semiconductor Lasers", Electronics Letters, vol. 30, No. 17, Aug. 18, 1994.
International Search Report, Oct. 11, 2002.

(List continued on next page.)

Primary Examiner—Don Wong
Assistant Examiner—Hung Tran Vy
(74) Attorney, Agent, or Firm—Blakely, Sokoloff, Taylor & Zafman LLP

(57) ABSTRACT

Systems and methods for probing or evaluating optical loss characteristics associated with lasers by monitoring voltage across a laser gain medium, and a laser and method of laser operation wherein intra-cavity losses are determined by monitoring voltage across a gain medium and wherein the cavity loss profile is adjusted according to the voltage across the gain medium.

25 Claims, 12 Drawing Sheets

U.S. PATENT DOCUMENTS

| | | |
|---|---|---|
| 5,103,457 A | 4/1992 | Wallace et al. |
| 5,115,677 A | 5/1992 | Martin et al. |
| 5,124,993 A * | 6/1992 | Braunlich et al. ............ 372/31 |
| 5,141,316 A | 8/1992 | Lefevre et al. |
| 5,163,063 A * | 11/1992 | Yoshikawa et al. ...... 372/38.02 |
| 5,172,185 A | 12/1992 | Leuchs et al. |
| 5,181,078 A | 1/1993 | Lefevre et al. |
| 5,181,214 A | 1/1993 | Berger et al. |
| 5,185,643 A | 2/1993 | Vry et al. |
| 5,222,070 A * | 6/1993 | Niki ............................ 372/25 |
| 5,225,930 A | 7/1993 | Land et al. |
| 5,245,626 A * | 9/1993 | Burke et al. .................. 372/92 |
| 5,251,222 A * | 10/1993 | Hester et al. ................. 372/26 |
| 5,270,791 A | 12/1993 | Lefevre et al. |
| 5,289,491 A | 2/1994 | Dixon |
| 5,305,330 A | 4/1994 | Rieder et al. |
| 5,319,668 A | 6/1994 | Luecke |
| 5,321,717 A | 6/1994 | Adachi et al. |
| 5,331,651 A | 7/1994 | Becker et al. |
| 5,347,527 A | 9/1994 | Favre et al. |
| 5,349,439 A | 9/1994 | Graindorge et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,412,676 A | 5/1995 | Schnier et al. |
| 5,414,280 A | 5/1995 | Girmay |
| 5,418,800 A * | 5/1995 | Prior et al. .................... 372/45 |
| 5,420,687 A | 5/1995 | Kachanov |
| 5,428,700 A | 6/1995 | Hall |
| 5,438,579 A | 8/1995 | Eda et al. |
| 5,444,724 A | 8/1995 | Goto |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,673,129 A | 9/1997 | Mizrahi |
| 5,712,704 A | 1/1998 | Martin et al. |
| 5,719,674 A | 2/1998 | Martin et al. |
| 5,737,109 A | 4/1998 | Goodwin |
| 5,751,750 A | 5/1998 | Friede et al. |
| 5,760,391 A | 6/1998 | Narendran |
| 5,777,773 A | 7/1998 | Epworth et al. |
| 5,802,085 A | 9/1998 | Lefevre et al. |
| 5,812,716 A | 9/1998 | Ohishi |
| 5,825,792 A | 10/1998 | Villeneuve et al. |
| 5,848,092 A | 12/1998 | Mitsumoto et al. |
| 5,872,881 A | 2/1999 | Rossi et al. |
| 5,886,785 A | 3/1999 | Lefevre et al. |
| 5,917,188 A | 6/1999 | Atkinson et al. |
| 5,943,352 A | 8/1999 | Fee |
| 5,946,331 A | 8/1999 | Amersfoort et al. |
| 5,991,061 A | 11/1999 | Adams et al. |
| 6,018,535 A | 1/2000 | Maeda |
| 6,034,799 A | 3/2000 | Hansen |
| 6,040,950 A | 3/2000 | Broome |
| 6,044,095 A * | 3/2000 | Asano et al. ................. 372/31 |
| 6,061,369 A | 5/2000 | Conradi |
| 6,064,501 A | 5/2000 | Roberts et al. |
| 6,081,539 A | 6/2000 | Mattori et al. |
| 6,084,695 A | 7/2000 | Martin et al. |
| 6,108,355 A | 8/2000 | Zorabedian |
| 6,115,121 A | 9/2000 | Erskine |
| 6,151,337 A | 11/2000 | Carlsten et al. |
| 6,181,717 B1 | 1/2001 | Kner et al. |
| RE37,044 E | 2/2001 | Wu |
| 6,192,058 B1 | 2/2001 | Abeles |
| 6,201,638 B1 | 3/2001 | Hall et al. |
| 6,205,159 B1 | 3/2001 | Sesko et al. |
| 6,215,802 B1 | 4/2001 | Lunt |
| 6,229,835 B1 | 5/2001 | Tomaru et al. |
| 6,233,045 B1 * | 5/2001 | Suni et al. ................. 356/28.5 |
| 6,246,480 B1 | 6/2001 | O'Brien |
| 6,249,364 B1 | 6/2001 | Martin et al. |
| 6,249,365 B1 | 6/2001 | Mizrahi et al. |
| 6,252,718 B1 | 6/2001 | Lefevre |
| 6,259,712 B1 * | 7/2001 | DeCain et al. ................. 372/32 |
| 6,263,004 B1 | 7/2001 | Arvidsson et al. |
| 6,282,215 B1 | 8/2001 | Zorabedian et al. |
| 6,301,280 B1 * | 10/2001 | Broutin et al. ........... 372/38.01 |
| 6,304,586 B1 | 10/2001 | Pease et al. |
| 6,330,253 B1 | 12/2001 | Tuganov et al. |
| 6,331,892 B1 | 12/2001 | Green |
| 6,337,660 B1 | 1/2002 | Esman et al. |
| 6,366,592 B1 * | 4/2002 | Flanders ...................... 372/18 |
| 6,366,689 B1 | 4/2002 | Rao et al. |
| 6,404,538 B1 * | 6/2002 | Chen et al. ................. 359/323 |
| 6,441,933 B1 | 8/2002 | Jang |
| 6,470,036 B1 | 10/2002 | Bailey et al. |
| 6,532,091 B1 | 3/2003 | Miyazaki et al. |
| 2002/0048297 A1 | 4/2002 | Irie et al. |
| 2002/0126345 A1 | 9/2002 | Green et al. |
| 2002/0136104 A1 * | 9/2002 | Daiber .................... 369/44.23 |

OTHER PUBLICATIONS

Favre et al.: 'External–Cavity Semiconductor Laser With 15 nm Continuous Tuning Range', Electronics Letters Jun. 19, 1986.

Macleod, H.A. in *Thin Film Optical Filters* $2^{nd}$ Edition, McGraw–Hill, 1989, pp. 244–269.

Mellis et al.: 'Miniature Packaged External–Cavity Semiconductor Laser With 50Ghz Continuous Electrical Tuning Range' Electronics Letters Apr. 22, 1988.

Siegman A. E., "An Introduction to Lasers and Masers," McGraw–Hill, Inc., 1971.

Takashahi, H., Temperature Stabillity of Thin–Film Narrow–Bandpass Filters Produced by Ion–Assisted Deposition Applied Optics vol. 34 No. 4 Feb. 1, 1995.

* cited by examiner

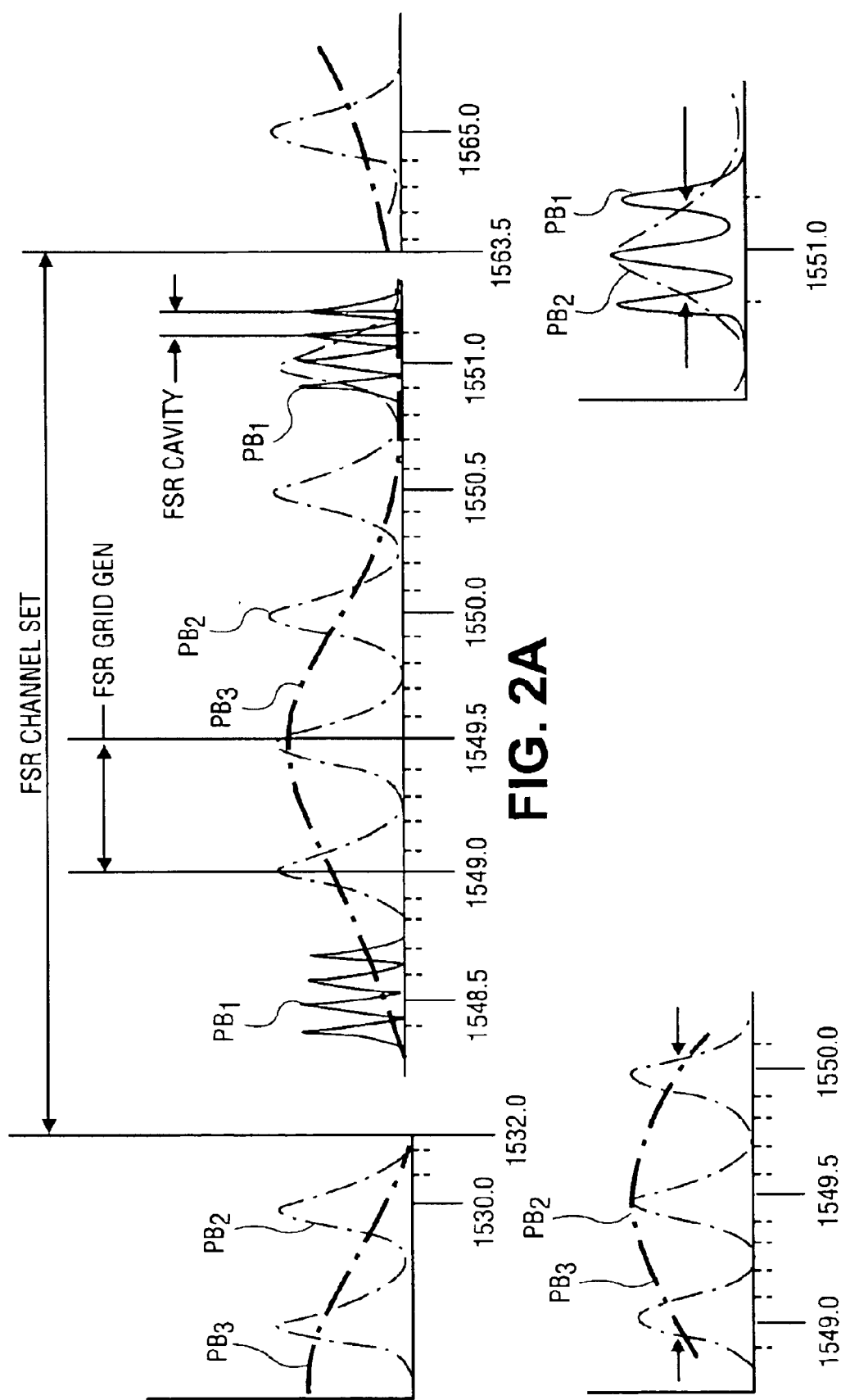

EVALUATION AND ADJUSTMENT OF LASER LOSSES ACCORDING TO VOLTAGE ACROSS GAIN MEDIUM

BACKGROUND OF THE INVENTION

The demand for increased bandwidth optical communication systems has lead to use of increasingly sophisticated lasers for signal transmission via multiple separate, concurrent data streams in a single optical fiber. Each data stream is modulated onto the output beam of a corresponding transmitter laser operating at a specific channel wavelength, and the modulated outputs from the lasers are combined onto a single fiber for transmission in their respective channels. The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future, and require greater precision from laser transmission devices.

In order to maximize optical transmission power and maintain wavelength stability in telecommunication transmitter lasers, steps are taken during transmitter manufacturing, assembly, and operation to minimize optical losses associated with laser operation. Two methods are generally used to characterize optical loss; measuring the laser output power, and measuring the laser threshold current. For example, in an external cavity diode laser, an end mirror is used to direct or feed back light into the gain medium. If the end mirror tilts or is not properly adjusted, a loss in the amount of light fed back into the cavity occurs. Once the end mirror is adjusted to a loss minimum, the mirror may be fixed in place at the time of manufacture. Alternatively, the loss associated with the end mirror tilt can be monitored during operation and continually minimized. An example is the adjusting of the period of a Bragg grating which feeds back light into a gain section of a DFB (distributed feedback) laser.

Both optical power measurement and threshold measurement have drawbacks when used to identify loss minima. In measuring optical power, a loss minimum does not necessarily correspond to an output power maximum. Assuming that the loss is not perfectly distributed throughout the gain medium, for example, when the loss occurs outside the gain media, then the laser will shift its internal distribution of power to send more power toward the loss. An increase in the loss may cause the power, as measured by the output of the laser, to increase, stay the same, or decrease depending on particular circumstances. The equations which relate output power to cavity losses are often very difficult to solve, even qualitatively, making output power an unreliable indicator of the intracavity loss associated with the alignment of a particular loss element. The total power exiting the gain medium is a relatively reliable indicator of relative cavity loss, but this quantity is difficult to measure.

Measuring laser threshold current to determine loss minima also has many drawbacks. The advantage of measuring laser threshold current is that a minimum of laser threshold current corresponds to a minimum of cavity loss. Laser threshold current is normally determined by adjusting the current injected into a gain region to determine the current where laser threshold is first observed. An important drawback is that changing the injection current changes the optical path length or thickness of the gain medium because the temperature of the gain medium (and thus its dimensions) changes along with other effects. A change in optical path length changes the wavelength of laser operation, and when loss must be minimized in-cavity with other losses which are wavelength dependent, or when loss must be minimized at a specific frequency of operation, the laser threshold is difficult or impossible to measure. Furthermore, laser threshold current cannot be used to minimize losses at high power and high current or constant power or constant current because it is measured at a current where lasing action is first observed.

As increasingly sophisticated transmitter lasers are required to meet increased band width needs, improved systems and methods for loss evaluation will be required, together with the ability to correct for losses which arise after manufacturing and assembly and losses which are related to the operation of the laser.

SUMMARY OF THE INVENTION

The invention provides systems and methods for probing or evaluating optical loss characteristics associated with lasers utilizing semiconductor gain media by monitoring voltage across a laser gain region. The invention also provides a method of laser operation wherein intracavity losses are determined by monitoring voltage across a gain region, a method for adjusting intracavity loss elements during laser operation to optimize loss profiles associated with the various loss elements, and a method for wavelength stabilization and control in external cavity lasers. The invention utilizes the fact that optical feedback into the gain region from loss elements outside the gain region is accurately detectable in the voltage across the gain region during laser operation.

The invention, in one embodiment, is a method for controlling or operating a laser cavity comprising monitoring voltage across a gain region emitting a coherent beam along an optical path, and determining optical losses associated with the laser cavity according to the monitored voltage. The method may further comprise adjusting a loss characteristic of the laser cavity according to the monitored voltage across the gain medium. The adjustment of the loss characteristic may comprise adjusting the position or other property of a loss element positioned in the optical path of a laser cavity. The laser may be an external cavity laser, and the loss element may comprise, for example, the end mirror, or a tunable filter placed external to a semiconductor gain medium.

There may be multiple additional loss elements present in the optical path or otherwise associated with the external cavity, such as a grid generator, channel selector, collimating optics, polarizing optics and other optical components, and losses associated with each such element may be evaluated, and adjustment of each loss element may be carried out, according to the monitored voltage across the gain medium.

In certain embodiments, evaluation of loss characteristics and adjustment of the loss element may be carried out by introducing a frequency modulation or dither to the loss element that is detectable in the monitored voltage. An error signal indicative of the propagation characteristics of the frequency dither, and hence the loss characteristics associated with the loss element, is derived from the monitored voltage, and is used to adjust the loss element to control the laser cavity loss profile. Where multiple loss elements are present, a separate frequency dither may be introduced to each loss element to provide corresponding error signals indicative of loss characteristics associated with each loss element. The introduction of the frequency dither to each loss element, as well as the adjustment of each loss element, may be carried out sequentially. Alternatively, different, non-interfering frequency dithers may simultaneously be introduced to each of the loss elements such that the propagation characteristics of each frequency dither are detectable in the monitored voltage across the gain medium, and such that each loss element may be simultaneously adjusted to control the loss profile of the external cavity.

A dither may also be employed wherein a loss element is varied among two or more positions and the laser voltage measured at each position. The nominal operating point may then be set to the position with the better laser voltage. Multiple elements may be optimized in this way by sequencing the dithering of each element to occur at different times.

Multiple dither elements may be used in association with multiple degrees of positional freedom of the loss element such that each dither element produces a frequency dither capable of being detected in the monitored voltage. Errors signals derived from the frequency dithers are used by the control system to positionally adjust the multiple degrees of positional freedom of the loss element. Multiple dither elements may also be used in association with multiple loss elements to allow simultaneous or sequential evaluation of loss characteristics associated with each loss element associated with laser cavity, and corresponding adjustment of each loss element to control the loss profile of the laser cavity.

In another embodiment, the invention is an external cavity laser apparatus comprising a gain medium emitting a coherent beam along an optical path, an end mirror positioned in the optical path such that the end mirror and a rear facet of the gain medium define an external cavity, and a voltage sensor operatively coupled to the gain medium and configured to monitor voltage across the gain medium. The monitored voltage across the gain medium is indicative of optical losses associated with the external cavity, and may be used to control the external cavity loss profile. The external laser cavity may comprise a control system operatively coupled to the voltage sensor and to one or more loss elements in the optical path in the external cavity, with the control system configured to adjust the loss element(s) according to monitored voltage across the gain medium.

BRIEF DESCRIPTIONS OF THE DRAWINGS

FIGS. 2A–2C are graphical illustrations of passband characteristics of the external cavity laser of FIG. 1 for the channel selector, grid etalon and external cavity with respect to a selected channel in a wavelength grid.

DETAILED DESCRIPTION OF THE INVENTION

Figure 1:
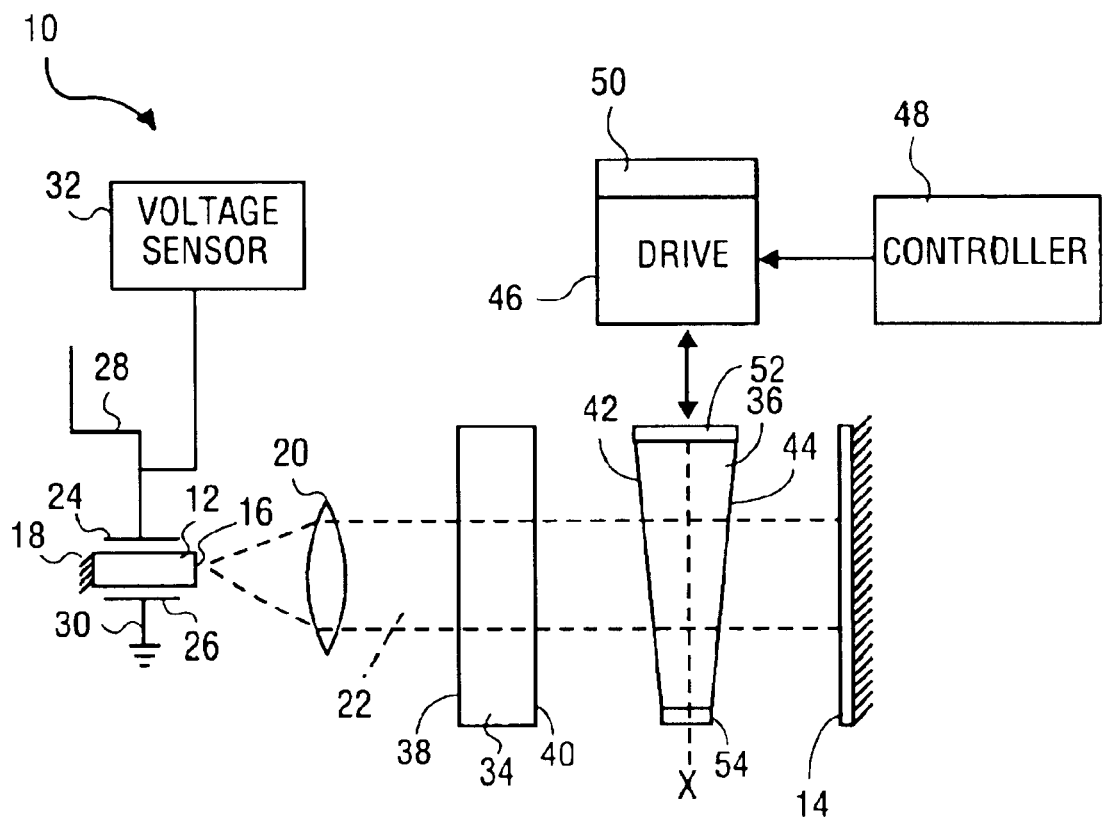
FIG. 1 is a schematic diagram of an external cavity laser apparatus illustrating the monitoring of voltage across a gain medium to probe losses associated with selected loss elements in the external cavity.

Referring more specifically to the drawings, for illustrative purposes the present invention is embodied in the apparatus and method shown in FIG. 1 through FIG. 10. Disclosed herein are systems and methods for evaluating losses associated with a laser cavity and for controlling the loss profile of the laser cavity by monitoring voltage across a laser gain region or medium of a laser. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with any laser device or system having a semiconductor gain medium or region. It also should be understood that the terminology used herein is for the purpose of describing particular embodiments only, and is not intended to be limiting.

The invention takes advantage of the fact that the voltage across a diode laser gain region is a function of carrier density in the active region. The voltage V across a diode laser can be represented by equation (1)

$$V = IR_s + V_d \tag{1}$$

wherein I is the drive or pump current, $R_s$ is the series resistance, and $V_d$ is the diode voltage. Using a constant current source, the value $IR_s$ can be taken as a constant. The diode voltage $V_d$ is equal to the quasi-Fermi level separation $E_{fc} - E_{fv}$ that is determined by the carrier density in the diode laser gain medium.

For the conduction band of the diode gain medium, the excess electron density N is given by equation (2)

$$N = 2 \int_{E_c}^{\infty} \rho(E - E_c) f_c(E) dE \tag{2}$$

wherein $\rho$ is the density of states, $E_c$ is the lowest energy level of the conduction band of the active medium, and $f_c(E)$ is the quasi-Fermi distribution. The quasi-Fermi distribution can be expressed by equation (3)

$$f_c(E) = \frac{1}{1 + \exp\left[\frac{E - E_{f_c}}{K_B T}\right]} \quad (3)$$

wherein $E_{f_c}$ is the quasi-Fermi level and KB is the Boltzmann constant.

According to equations (2) and (3) above, higher electron concentration N corresponds to a higher quasi-Fermi level $E_{f_c}$. Furthermore, to good approximation for currents above the diode laser threshold current $I_{th}$, the electron density N is fixed or "clamped" at its threshold value $N_{th}$. Similarly, in the valence band, a higher density of holes P (neutral conditions require that P=N) corresponds to a lower quasi-Fermi level $E_{f_v}$ in the valence band.

When the diode laser gain region is operated in a laser cavity as described below, the threshold electron density value $N_{th}$ will be determined by the total cavity loss. Since the diode voltage $V_d$ obeys the relationship $V_d = E_{f_c} - E_{f_v}$, minimum cavity loss will correspond to a minimum electron density threshold $N_{th}$, and hence to a minimum diode voltage $V_d$. Thus, voltage across the diode laser gain medium reflects losses associated with the cavity.

With the above in mind, reference is now made to FIG. 1 wherein is shown external cavity laser apparatus 10 configured for monitoring of voltage across a gain region. The apparatus 10 includes a gain medium 12 and an end or external reflective element 14. Gain medium 12 may comprise a conventional Fabry-Perot diode emitter chip and has an anti-reflection (AR) coated front facet 16 and a partially reflective rear facet 18. Output facet 18 and end mirror 14 define a laser cavity for the apparatus 10. Gain medium 12 emits a coherent beam from front facet 16 that is collimated by lens 20 to define an optical path 22 that is co-linear with the optical axis of the external cavity. Output facet 16 may alternatively comprise an "angle facet". Conventional output coupler optics (not shown) are associated with rear facet 18 for coupling the output of external cavity laser 10 into an optical fiber (also not shown).

Various losses or loss characteristics will be associated with the external cavity due to end mirror 14 or other loss elements (described below) within the external cavity. These external cavity losses can be probed or evaluated by monitoring the voltage across gain medium 12. In this regard, first and second electrodes 24, 26 are positioned adjacent to and operatively coupled to gain medium 12. First electrode 24 is operatively coupled to a drive current source (not shown) via conductor 28, and second electrode is grounded via conductor 30. A voltage sensor 32 is operatively coupled to conductor 28 and is configured to measure or monitor the voltage across gain medium 12 during operation of external cavity laser 10. Voltage sensor 32 may alternatively be coupled to either electrode 24, 26 or to conductor 30. Since voltage across the gain medium can be detected easily and with good accuracy, voltage sensor 32 need not be immediately adjacent to gain medium, and may be associated with conductor 28 or 30 at a point remote from gain medium 12.

Light reflected from end mirror 14 is fed back along optical path 22 into gain region 12. Losses associated with end mirror 14 due to angular misregistration with respect to the cavity optic axis alters the optical feedback into gain medium 12 which is detectable by voltage sensor as a variation or variations in voltage across gain medium 12. Error signals may be derived from the voltage measured across gain medium 12 to correct or otherwise adjust the loss characteristics associated with external cavity due to end mirror 14 or other loss elements associated with the external cavity.

Other loss elements associated with the external cavity may include a grid generator element and a channel selector element, which are respectively shown in FIG. 1 as a grid etalon 34 and a channel selector 36 positioned in optical path 22 between gain medium 12 and end mirror 14. Grid etalon 34 typically is positioned in optical path 22 before wedge etalon 26, and has parallel reflective faces 38, 40. Grid etalon 34 operates as an interference filter, and the refractive index of grid etalon 34 and optical thickness of grid etalon 24 as defined by the spacing of faces 38, 40 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon 34 thus has a free spectral range (FSR) that corresponds to the spacing between the grid lines of the ITU grid or other selected grid, and the grid etalon 34 thus operates to provide a plurality of passbands centered on each of the gridlines of the wavelength grid. Grid etalon 34 has a finesse (free spectral range divided by full width half maximum or FWHM) that suppresses neighboring modes of the external cavity laser between each channel of the wavelength grid.

Grid etalon 35 may be a parallel plate solid, liquid or gas spaced etalon, and may be tuned by precise dimensioning of the optical thickness between faces 38, 40 by thermal expansion and contraction via temperature control. The grid etalon 34 may alternatively be tuned by tilting to vary the optical thickness between faces 38, 40, or by application of an electric field to an electro-optic etalon material. Various other grid generating elements are know to those skilled in the art and may be used in place of grid etalon 34. Grid etalon 35 may be thermally controlled to prevent variation in the selected grid that may arise due to thermal fluctuation during operation of external cavity laser 10. Grid etalon 34 alternatively may be actively tuned during laser operation as described in the U.S. patent application Ser. No. 09/900,474 entitled "External Cavity Laser with Continuous Tuning of Grid Generator" to inventor Andrew Daiber, co-filed herewith and incorporated herein by reference.

Optical losses arise when the wavelength at which the laser is lasing deviates from a transmission peak of the grid etalon 34. These loss characteristics are detectable in the voltage monitored across gain medium 12. An error signal derived from the voltage can be used to adjust the cavity length and, as a consequence, the wavelength of lasing, until the wavelength corresponds to a local maxima of the transmission spectrum of grid etalon 34. The cavity length may be changed by translating end mirror 14 along the optical axis defined by beam 22, by heating and thermally expanding the optical path length of gain region 12, or by other procedure. The error signal may be generated by measuring the voltage sensed by voltage sensor 32 when end mirror 14 is translated or dithered by a small positive or negative distance from the operating point considered to be correct. If the voltage sensor 32 detects a smaller voltage across the gain region 12 at one of the deviated positions, then the nominal operating position of end mirror 14 can be translated towards the corresponding deviated position. Alternatively, the dithering of the end mirror may be done continuously at one dither frequency, and a lock-in amplifier (not shown) used to detect the voltage signal observed by sensor 32 that is synchronous to the dither frequency. This synchronous voltage signal constitutes an error signal, and a PID controller (not shown) may be used to reposition end mirror 14 and drive the error signal to zero.

The Channel selector 36 is shown as a wedge-shaped etalon with faces or surfaces 42, 44. The separation between surfaces 42 and 44 may be finely changed along the laser axis, by an amount less then or equal to the wavelength of operation, by extending surfaces 42 and 44 beyond the area where the beam strikes these surfaces and tapering the spacer between these surfaces such that the taper is small enough that the thickness change between 42 and 44 across the laser beam is negligible or tolerable and such that the taper is large enough that macroscopic motion of the filter across the beam introduces a microscopic change in the distance between 42 and 44 along the beam. The space between surfaces 42 and 44 may be gas filled, liquid filled, or filled with a solid. The space between surfaces 42 and 44 may be changed by thermally expanding a solid etalon, by thermally, piezoelectrically, or micromechanically expanding the spacing in a gas or liquid etalon, by tilting of a gas, solid, or liquid etalon, by changing the pressure of a gas etalon, by using an electrooptic material as a spacer and changing refractive index with an applied electric field, by using a nonlinear optical material in the spacer layer and inducing a path length change with second optical beam, or any other system or method suitable for wavelength tuning.

A wedge etalon channel selector 36 as shown in FIG. 1 is only one tunable element that may be used in accordance with the invention in an external cavity laser. Various other types of channel selector may be used in the invention. The use of an air gap wedge etalon for channel selection is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter as a channel selector is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The relative size, shape and distances between the various optical components of external cavity laser 10 are in some instances exaggerated for clarity and are not necessarily shown to scale. External cavity laser 10 may include additional loss elements (not shown), such as focusing and collimating components, and polarizing optics configured to remove spurious feedback associated with the various components of external cavity laser 10. The location of grid generator 34 and channel selector 36 may vary from that shown in FIG. 1.

Channel selector 36 defines a plurality of passbands which are substantially broader than the passbands of the grid etalon 34, with the broader passbands of the channel selector 36 having a periodicity substantially corresponding to or greater than the separation between the shortest and longest wavelength channels defined by the grid etalon 34. In other words, the free spectral range of the channel selector 36 exceeds the full wavelength range of the wavelength grid defined by grid etalon 34. The channel selector 36 has a finesse that suppresses lasing at channels adjacent to a particular selected channel.

The channel selector 36 is used to select between multiple communication channels by changing the optical thickness between faces 42, 44 of channel selector 36. This is achieved by translating or driving channel selector 36 along axis x, which is parallel to the direction of taper of channel selector 36 and perpendicular to optical path 22 and the optical axis of external cavity laser 10. Each of the passbands defined by the channel selector 36 supports a selectable channel, and as the wedge is advanced or translated into optical path 22, the beam traveling along optical path 22 passes through increasingly thicker portions of channel selector 36 which support constructive interference between opposing faces 42, 44 at longer wavelength channels. As channel selector 36 is withdrawn from optical path 22, the beam will experience increasingly thinner portions of channel selector 36 and expose passbands to the optical path 22 that support correspondingly shorter wavelength channels. The free spectral range of channel selector 36 corresponds to the complete wavelength range of grid etalon 34 as noted above, so that a single loss minimum within the communications band can be tuned across the wavelength grid. The combined feedback to gain medium 12 from the grid etalon 34 and channel selector 36 support lasing at the center wavelength of a selected channel. Across the tuning range, the free spectral range of the channel selector 36 is broader than that of grid etalon 34.

Channel selector 36 is positionally tuned via a tuning assembly which comprises a drive element 46 structured and configured to adjustably position or otherwise tune channel selector 36 to selected channels. Drive element 46 may comprise, for example, a stepper motor together with suitable hardware for precision translation of channel selector 36. Drive element 46 may alternatively comprise various types of actuators, including, but not limited to, DC servomotors, solenoids, voice coil actuators, piezoelectric actuators, ultrasonic drivers, shape memory devices, and like linear actuators. Where a different type of channel selector other than a wedge etalon is used with the invention, wavelength tuner drive 46 will accordingly be configured to tune the channel selector. A linear encoder 50 may be used in association with wedge etalon 26 and wavelength tuner drive 46 to ensure correct positioning of wedge etalon 36 by drive 46. A coarse spectrometer which monitors the wavelength of operation may be used to ensure correct positioning of wedge etalon 36 by drive 46 or the correct positioning of an alternative embodiment of the channel selector by its associated drive.

Optical losses associated with channel selector 36 will arise when the wavelength of the beam along optical path 22 does not correspond to the wavelength of maximum transmission of channel selector 36 at the location where the beam along optical path 22 intersects channel selector 36. It is assumed that the wavelength is correct, having previously been adjusted to a transmission maximum of gird etalon 34 and that the channel selector is in error. The wavelength of maximum transmission for channel selector 36 can be changed by changing the separation between reflective surfaces 42 and 44. This separation may be changed by utilizing channel selector 36 which has surfaces 42 and 44 spaced by different amounts along its length, and translating channel selector 36 with drive 46 until the correct spacing between surfaces 42,44 is present at the location where beam 22 transmits through the channel selector 36.

A signal usable to determine how to translate channel selector 36 may be derived by dithering the position of the channel selector 36 to either side of a nominal operating point to introduce a frequency modulation to the channel selector 36, and measuring the voltage modulation across the gain region to develop an error signal. If the voltage to either side of the nominal operating point is lower than the nominal operating point than the nominal operating point is reset in the direction of the improved point. Alternatively, the channel selector 36 may be harmonically dithered and an error signal derived from the AC laser voltage signal seen at the dither frequency. Other designs of channel selector 36 may be adjusted by dithering the effective separation of their reflective surfaces using techniques analogous to those described for channel selector 36. The use of a dither element to provide frequency modulation to channel selector 36 or other optical component is discussed further below. The use of a dither element to introduce a frequency modulation to a cavity loss element is discussed further below.

Drive element 46 is operatively coupled to a controller 48 that controls the positioning of channel selector 36 by drive element 46. Control of channel selector 36 may be carried out according to error signals derived from frequency modulation of channel selector 36 and the monitored voltage across gain medium 12 as noted above. Alternatively, or additionally, controller 48 may use stored lookup tables of positional information for channel selector 36 which correspond to selectable channel wavelengths. Controller 48 may be internal to driver element 46, or may be external and shared for positioning and servo functions for end mirror 14 and/or other components or loss elements in external cavity laser 10 as well as channel selector 36. A linear encoder 50 may be used in association with channel selector 36 and drive element 46 to ensure correct positioning of channel selector 36 by driver 46.

Channel selector 36 may include opaque regions 52, 54 at its ends that are optically detectable and which serve to verify the position of channel selector 36 when it has been positionally tuned beyond its longest or shortest channel wavelength. Opaque regions 52, 54 provide an additional encoder mechanism usable in the positional tuning of channel selector 36. When wedge 36 is moved into a position such that one of opaque regions 52, 54 enters optical path 22, the opaque region 52, 54 will block or attenuate the beam along optical path. This attenuation of light is detectable, as described further below. These opaque regions may be used as a "home" and "too-far" signals. The home signal can be used to initialize a coordinate system from which motor positions may be referenced. The position of the drive train away from home may then be determined by counting the number of steps or microsteps a stepper motor has taken and combining this information with the angle taken in a step and the pitch of the lead screw. Alternatively, an encoder may be attached to the drive train. The home signal may further be used to compensate for thermal expansion of the lead screw or mechanical wear of the drive nut by providing a reference close to the optical element and searching for this reference periodically.

The passband relationship of the grid etalon 34, channel selector 36 and the external cavity defined by rear facet 18 and end mirror 14 are illustrated graphically in FIG. 2A through FIG. 2C, which show external cavity passbands PB1, grid etalon passbands PB2, and wedge etalon passbands PB3. Relative gain is shown on the vertical axis and wavelength on the horizontal axis. As can be seen, free spectral range of the channel selector 36 ($FSR_{Channel\ Sel}$) is greater than the free spectral range of the grid etalon 34 ($FSR_{Grid\ Gen}$), which in turn is greater than the free spectral range of the external cavity ($FSR_{Cavity}$). The passband peaks PB1 of the external cavity periodically align with the center wavelengths of passbands PB2 defined by the wavelength grid of grid etalon 34. There is one passband peak PB3 from the channel selector 36 that extends over all of the passbands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 34 and channel selector 36 determine the attenuation of neighboring modes or channels. As noted above, finesse is equal to the free spectral range over the full width half maximum, or finesse=FSR/FWHM. The width for a grid etalon passband PB2 at half maximum is shown in FIG. 2B, and the width for a wedge etalon passband PB3 at half maximum is shown in FIG. 2C. This positioning of grid etalon 34 and channel selector 36 within the external cavity improves side mode suppression.

Figure 3A:
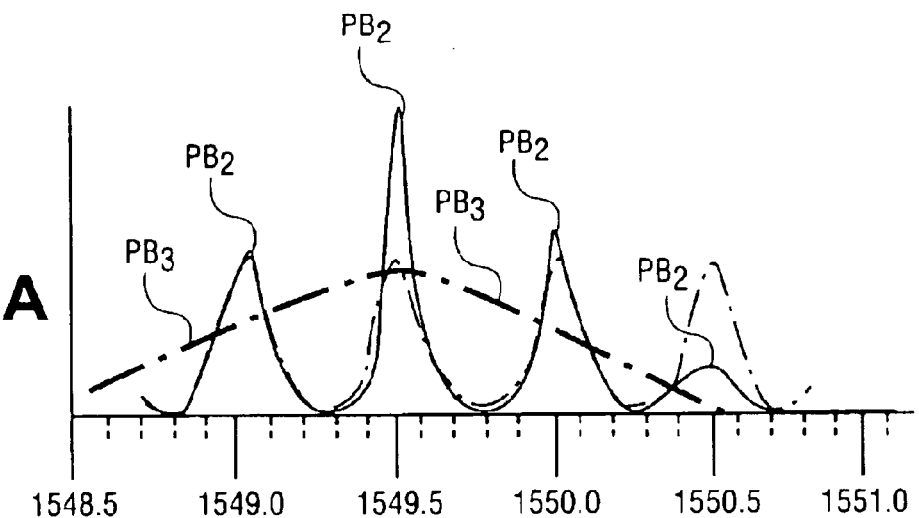
FIGS. 3A–3C are graphical illustrations of gain response to tuning of the external cavity laser of FIG. 1 for a plurality of channels in a wavelength grid.
Figure 3B:
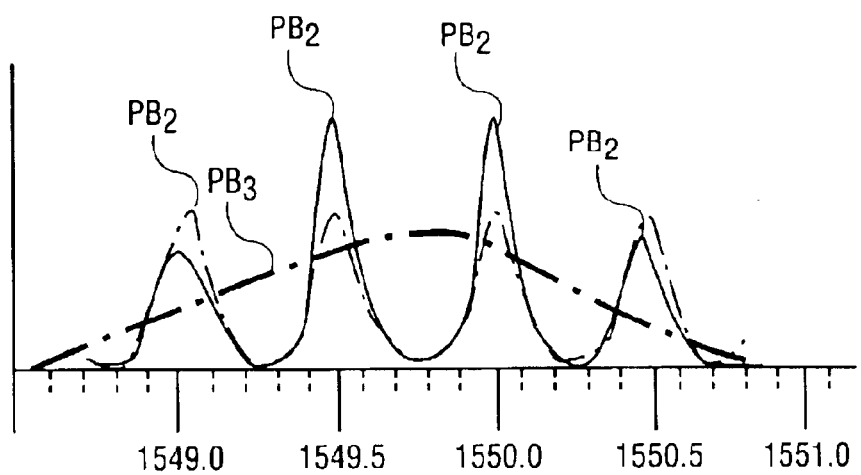
Figure 3C:
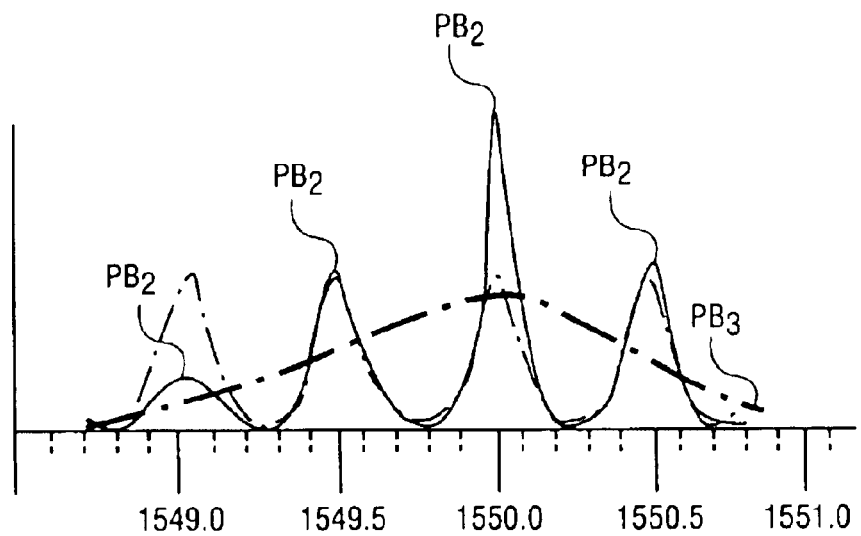

The tuning of the band pass PB3 of channel selector 36 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity passbands PB1 shown in FIGS. 2A–2C are omitted from FIGS. 3A–3C for clarity. The grid etalon 34 selects periodic longitudinal modes of the external cavity corresponding to the grid channel spacing while rejecting neighboring modes. The channel selector 36 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon passband PB3 is centered with respect to the grid channel at 1549.5 nm. The relative gain associated with passband PB2 at 1549.5 nm is high, while the relative gain levels associated with adjacent passbands PB2 at 1549.0 nm and 1550.0 nm are suppressed relative to the selected 1549.5 nm channel. The gain associated with passbands PB2 at 1550.5 nm and 1548.5 nm is further suppressed. The dashed line indicates the relative gain for passbands PB2 without suppression by channel selector 36.

FIG. 3B shows the wedge etalon passband PB at a position in between the channels at 1549.5 nm and 1550.0 nm, as occurs during channel switching. The relative gain associated with passbands PB2 at 1549.5 nm and 1550.0 nm are both high, with neither channel suppressed. The relative gain levels associated with passbands PB2 at 1549.0 nm and 1550.5 nm are suppressed relative to the 1549.5 nm and 1550.0 nm channels.

The dashed line indicates the relative gain for passbands PB2 without suppression by channel selector 36.

FIG. 3C shows the wedge etalon passband PB3 centered with respect to the grid channel at 1550.0 nm, with the relative gain associated with the passband PB2 at 1550.0 nm being high, while the relative gain levels associated with adjacent passbands PB2 at 1549.5 nm and 1550.5 nm are suppressed relative to the selected 1550.0 nm channel, and the gain associated with passbands PB2 at 1551.0 nm and 1549.0 nm is further suppressed. Again, the dashed line indicates the relative gain for passbands PB2 without suppression by channel selector 36.

As can be seen from FIG. 2 and FIG. 3, non-optimal positioning or tuning of channel selector 36, end mirror 14 and/or grid generator 34 will result in mis-alignment of passbands PB1, PB2 and PB3 and give rise to losses in optical output power and a decrease in side mode suppression ratio for the external cavity laser 10. Monitoring of voltage across gain medium 12 via voltage sensor 32 allows such external cavity loss characteristics to be probed or evaluated during laser operation. Error signals derived from the monitored voltage can then be used to adjust or servo the loss profile of the external cavity during operation such that passbands PB1, PB2 and PB3 are optimally aligned with respect to each other by suitable repositioning or adjusting of end mirror 14, channel selector 36 and/or grid etalon 34, thus providing accurate wavelength tuning and stability.

Figure 4A:
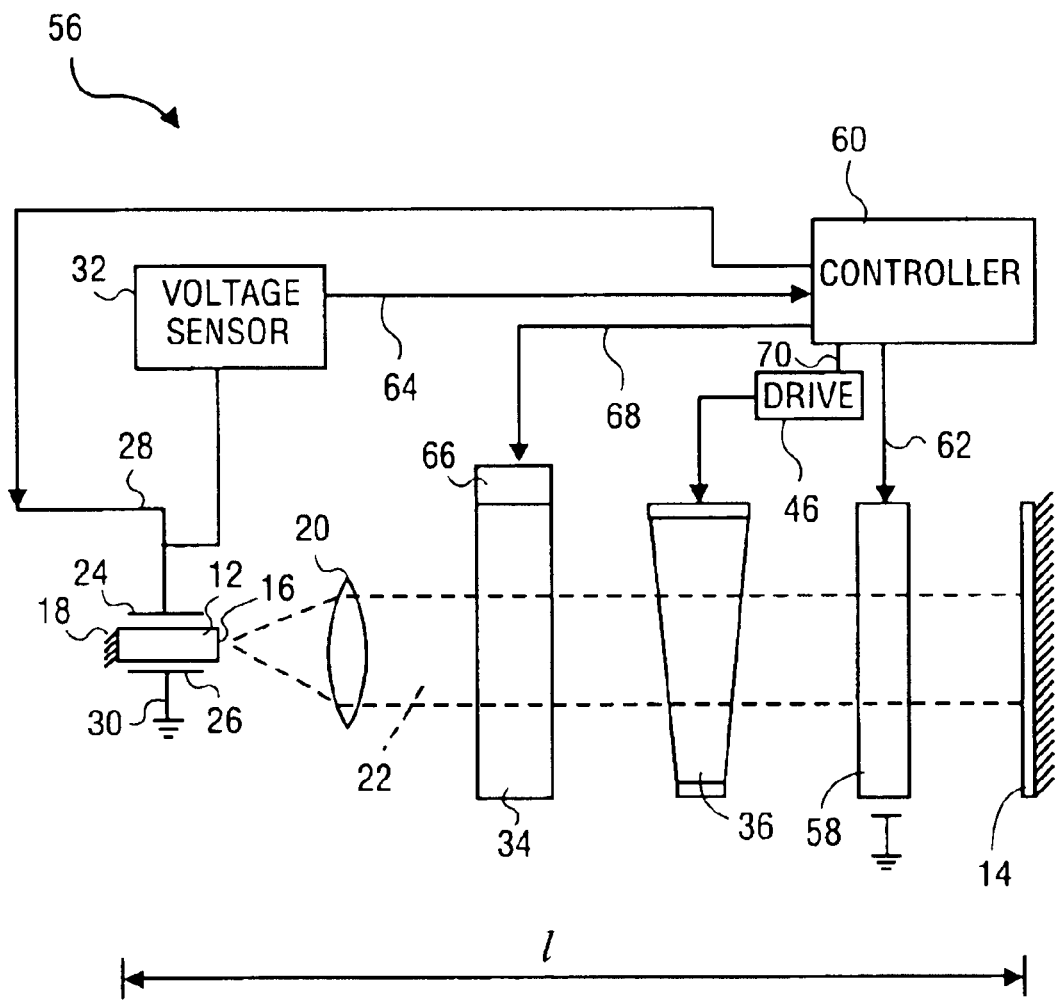
FIGS. 4A–4C are schematic diagrams of external cavity laser apparatus wherein monitoring the voltage across a gain medium is used to evaluate optical losses associated with end mirror positioning and to compensate for such losses according to error signals derived from the monitored voltage across the gain medium.

FIG. 4A illustrates another embodiment of an external cavity laser apparatus 56, wherein like reference numbers are used to denote like parts. In the embodiment of FIG. 4A, an electro-optically activated tuning element 58 is positioned in optical path 58 before end mirror 14. Tuning element 58 is operatively coupled to a controller 60 via communication interface 62. Controller 60 is operatively coupled to voltage sensor 32 via interface 64. A thermoelectric controller 66 is coupled to grid generator 34, and controller 60 is operatively coupled to thermoelectric controller 66 via communication interface 68. Controller 60 is also operatively coupled to gain medium via conductor 28, which serves as a communication interface. Controller 60 is operatively coupled to drive element or assembly 46 via communication interface 70. Drive element 46 is operatively coupled to channel selector 36.

Electro-optic tuning element 58 as shown in FIG. 4A provides a signal modulation in the form of a frequency dither, which is introduced into the optical path length of the external cavity laser 56 by the presence of element 58 in optical path 22. Tuning element comprises an etalon of electro-optic material such as lithium niobate or an electro-optic liquid crystalline material, and has a voltage-adjustable refractive index. As an alternative embodiment, a piezoelectric or micromechanical tuning element could be attached to the end mirror 14, with physical displacement of the end mirror 14 serving the same function as phase shifts in element 58. The signal modulation may comprise, for example, a frequency modulation of about 20 KHz. Adjustment of voltage across the electro-optic material of tuning element changes the effective optical thickness of tuning element 58, and hence the overall optical path length l across the external cavity (between diode facet 18 and end mirror 14) of external cavity laser 56. Thus, electro-optic tuning element 58 both (i) provides a frequency modulation signal or dither to the external cavity, and (ii) a mechanism to tune or adjust the external cavity optical path length by voltage applied across tuning element 58. Electro-optic tuning element 58 may alternatively comprise an acousto-optic device, mechanical device, or other device capable of introducing a detectable frequency dither or modulation signal into the output of the external cavity.

Modulation of the optical path length l via frequency dither introduced by element 58 produces intensity variations in the output power of external cavity laser 56 which are detectable in the monitored voltage across gain medium 12, due to optical feedback thereinto from the external cavity. These intensity variations will decrease in magnitude and phase error as a laser cavity mode is aligned with the center wavelength of the passbands defined by grid generator 34 and channel selector 36. In other words, the intensity variations and phase error in the modulation signal are minimal or nominally zero when passbands PB1, PB2 and PB3 are optimally aligned as shown in FIGS. 2A–2C. The use of intensity variation and phase error in the modulated signal with respect to error signal determination is described further below with reference to FIG. 7.

During operation of the external cavity laser 56, voltage signals from voltage sensor 32 are communicated to controller 60 via interface 64. Controller 60 derives an error signal from the modulation introduced by the frequency dither, and communicates a compensation signal via interface 62 to electro-optical tuning element which tunes or adjusts the optical path length l by changing the refractive index, and hence the effective optical path length, across electro-optic tuning element 58.

Controller 60, during the operation of laser 56, also controls the drive current to gain medium 12 by signals communicated via interface 28, and the positioning of channel selector 36 by drive element 46 according to signals communicated via interface 70. Controller 60 may also control the temperature of grid etalon 34 via thermoelectric controller 66 and signals communicated via interface 68. The operation of controller 60 in carrying out the above operations is described in more detail below with reference to FIG. 5A.

Figure 4B:
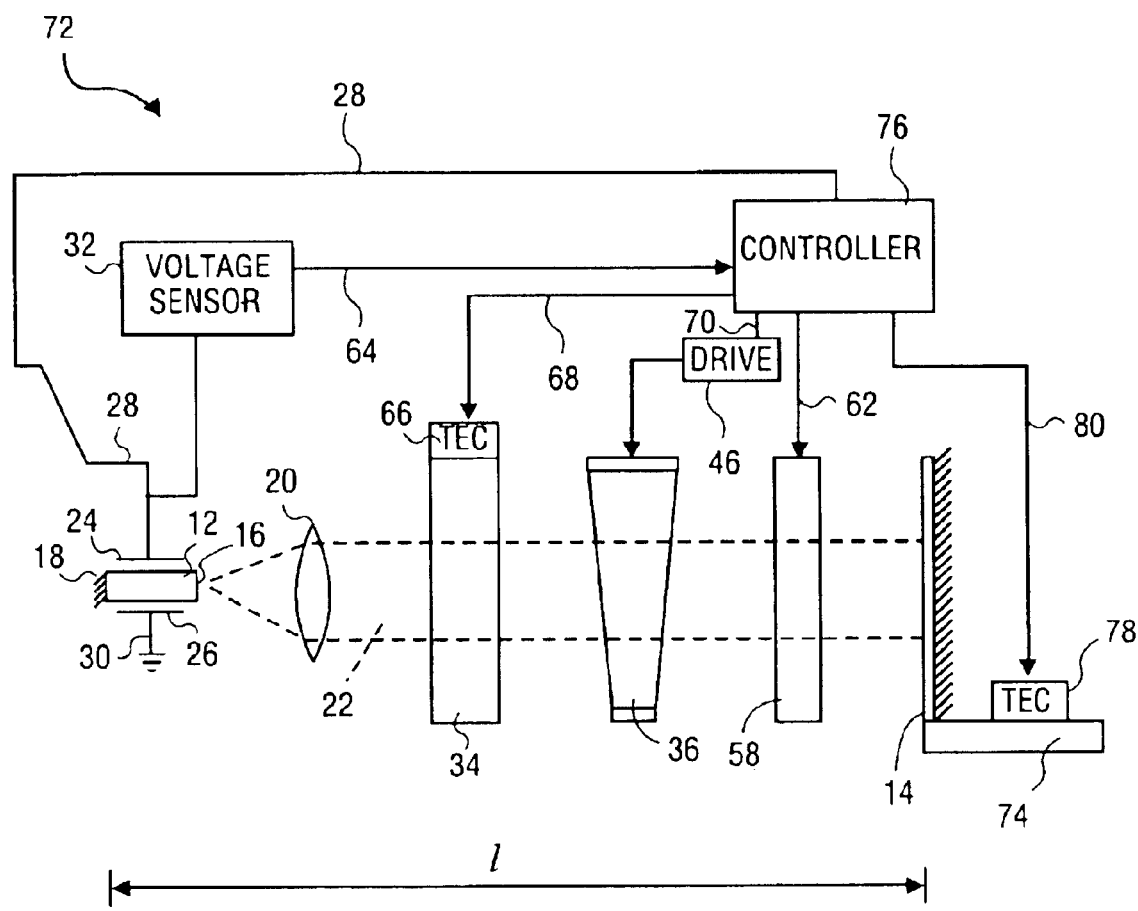

FIG. 4B shows another embodiment of an external cavity laser 72 wherein like reference numerals denote like parts. In the external cavity laser 72, the end mirror 14 is coupled to a tuning arm 74, which is used to positionally adjust end mirror according to instructions from controller 76. Tuning arm 74 is made from a material having a high coefficient of thermal expansion, such as aluminum or other metal or metal alloy. Controller 76 is operatively coupled to a thermoelectric controller 78 via communication interface 80. Thermoelectric controller 78 is coupled to tuning arm and configured to adjust the temperature of arm 74. Thermal control (heating or cooling) of tuning arm 74, according to signals from controller 76, is used in this embodiment to control the position of end mirror 14 and the length of optical path 1 of the external cavity defined by end mirror and diode facet 18.

The use of a thermally controlled tuning element to positionally adjust an end mirror and other optical components in an external cavity laser is also described in U.S. patent application Ser. No. 09/814,646 to inventor Andrew Diaber, filed on Mar. 21, 2001, and in U.S. patent application Ser. No. 09/900,443 entitled "Laser Apparatus with Active Thermal Tuning of External Cavity" to inventors Mark Rice et al., which is co-filed simultaneously herewith. These disclosures are incorporated herein by reference. End mirror 14 may alternatively be tuned or adjusted by various other tuning mechanisms according to error signals derived from voltage measured across gain medium 12. For example, end mirror 14 may be tuned by a phase compensator or mechanically positioned by a stepper motor operating according to instruction from controller 76.

In the operation of external cavity laser 72, electro-optic tuning element 58 introduces a frequency dither or modulation to the optical path length l of the external cavity in the manner described above. The frequency modulation is detectable by voltage sensor 32 in the voltage monitored across the gain medium 12, and the frequency modulation includes variations in magnitude and phase error indicative of laser cavity mode alignment with the center wavelength of the passbands defined by grid generator 34 and channel selector 36, as noted above. Controller 76 derives an error signal from the modulation introduced by the frequency dither, and communicates a compensation signal via interface 80 to thermoelectric controller 78, which accordingly heats or cools tuning arm 74 to position end mirror 14 and adjust the optical path length l of external cavity laser to null out the error signal. Controller 76 also controls the drive current to gain medium 12 via interface 28, the positioning of channel selector 36 by drive element 46 via interface 70, and the temperature of grid etalon 34 via thermoelectric controller and signals communicated via interface 68. The operation of controller 76 in carrying out the above operations is described in more detail below with reference to FIG. 5B.

Figure 4C:
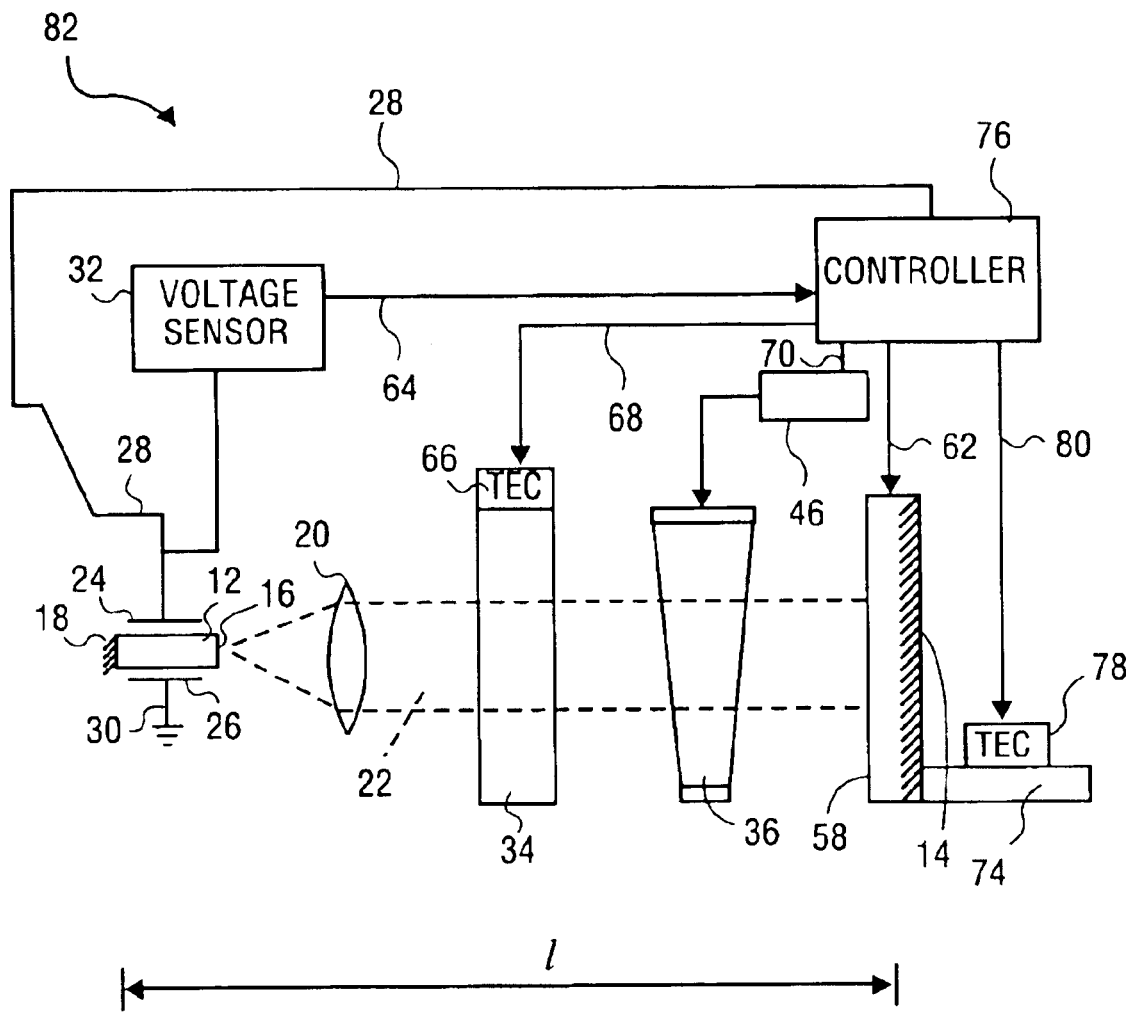

Referring to FIG. 4C, another embodiment external cavity laser apparatus 82 is shown, with like reference numerals used to denote like parts. In the apparatus 82, end mirror 14 is formed as a reflective coating directly on the electro-optic material of tuning element 58. Thus, the end mirror 14 and tuning element 58 are combined into a single component. Electro-optic tuning element 58 introduces a frequency dither or modulation to the optical path length l of the external cavity as described above, which is detected in the voltage across the gain medium 12 and used to derive an error signal. A corresponding compensation signal is delivered by controller 76 via interface 80 to thermoelectric controller 78, which heats or cools tuning arm 74 to as required to position end mirror 14 and adjust the optical path length l of external cavity laser to null out the error signal as described above. In other respects, the operation of external cavity laser is substantially the same as described above for external cavity laser 72. In the apparatus 82, tuning arm 74 and thermoelectric controller 78 may be omitted, and adjustment of optical path length l may be carried out directly via voltage control of the effective optical thickness of electro-optic tuning element as described above for external cavity laser apparatus 56 in FIG. 4A.

Figure 5A:
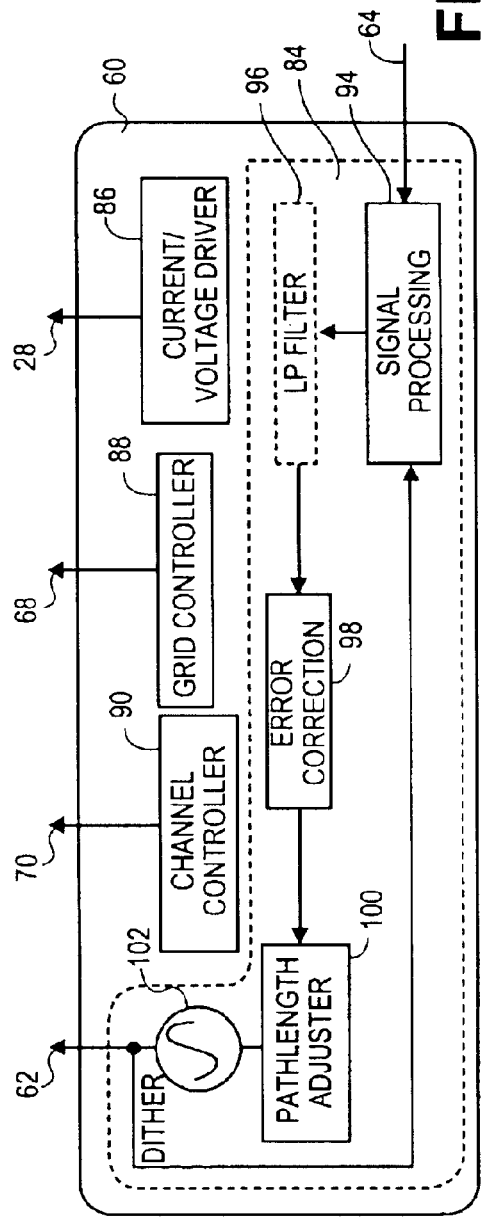
FIGS. 5A–5B are functional block diagrams of control systems for the external cavity lasers of FIGS. 4A–4C.
Figure 5B:
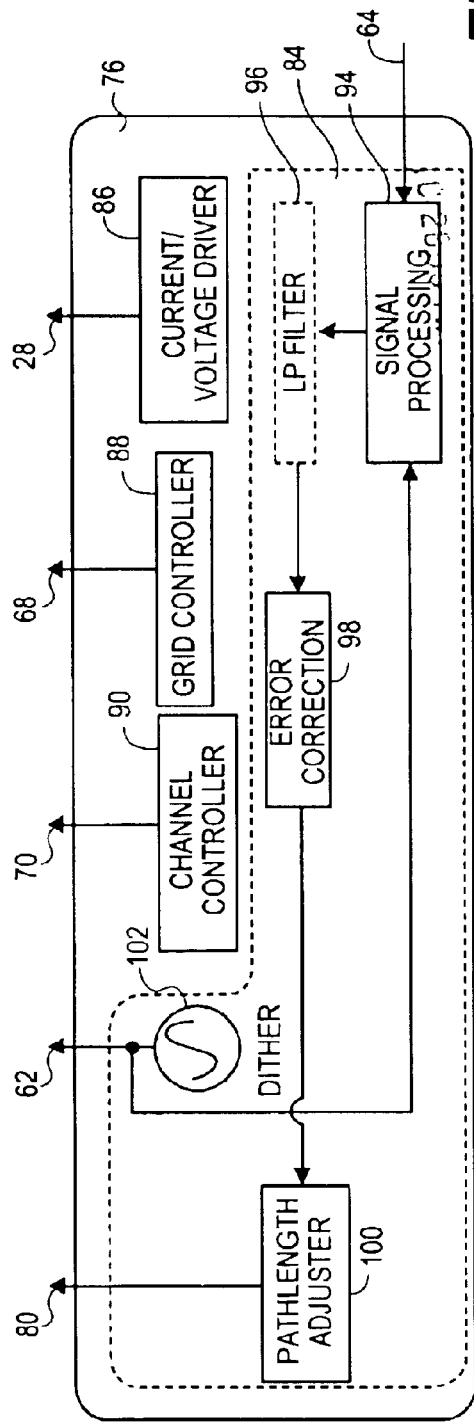

Referring now to FIG. 5A and FIG. 5B, there are shown functional block diagrams for the controllers 60, 76 of FIG. 4A and FIG. 4B respectively, with like reference numbers used to denote like parts. Controllers 60, 76 each include a tuning circuit 84, a current/voltage driver 86 operatively coupled to gain medium 12 via conductor 28, a grid controller 88 operatively coupled to thermoelectric controller 66 via interface 68, and a channel controller 90 operatively coupled to drive element 46 via interface 70. The current voltage driver 86 controls the power delivered to gain medium 12 via interface 28. The grid controller 88 maintains the referential integrity of grid etalon 34 by thermal control thereof using thermoelectric controller 66 to heat or cool grid etalon 34 as required. Channel controller 90 directs drive element 46 to position or otherwise adjust channel selector 36 for selection of desired transmission bands in the grid defined by grid etalon 34. Tuning circuit 84 also comprises a signal processor 94, an optical low pass filter 96, an error corrector 98, a path length adjuster 100, and a modulation signal generator or dither element 102.

Modulation signal generator 102 provides a frequency dither or modulation signal to a selected loss element (e.g., tuning element 254) that causes a corresponding modulation of the optical path l of the laser external cavity. The modulation frequency and amplitude may be selected, for example, to increase effective coupling efficiency. The voltage signal from voltage sensor 32 is communicated to tuning circuit 84 via communication line 28 and directed to signal processing circuit 94. The signal processing circuit 94 also accepts a reference modulation signal from dither element 102. The signal processing circuit 94 determines the alignment of passbands PB1 (FIG. 2 and FIG. 3) of the external cavity with passbands PB2 of grid etalon 34 and passbands PB3 of channel selector 36.

In one embodiment, signal processing is carried out using phase synchronous detection to determine the phase relationship between the modulation signal introduced by dither element 102 and the voltage intensity detected by voltage sensor 32. Error signals are created by signal processing 94 that is indicative of the relative phase between the dither modulation signal and sensed voltage intensity. The error signals are directed to error corrector 98 through low pass filter 96. Signal processing 94 may be implemented in a phase-locked loop in this embodiment.

In another embodiment, the signal processing 94 may monitor intensity variations and frequency of the voltage signal from voltage sensor 32 to determine when intensity variations are minimized. Such intensity variations are minimized and the frequency of the intensity signal is increased when passbands PB1, PB2 and PB3 achieve alignment. Error signals indicative of frequency and intensity variation are derived from the output of voltage sensor 32 and communicated to error corrector 98. Signal processing 94 alternatively may be responsive to selected harmonics of the modulation frequency provided by dither element 102.

Error corrector 98 generates an error correction or compensation signal, from the error signal provided by signal processing 94, that is used to adjust the optical path length l with path length adjuster 100 in order to optimize the relationship between the modulation signal and the intensity signal, or to drive the relationship between the modulation signal and intensity signal to a selected offset or value. When an external cavity mode or passband PB1 is aligned with bands PB2 and PB3 generated by grid generator 34 and channel selector 36, intensity variations at the modulation frequency (and odd multiples thereof) in the coherent beam traveling optical path 22 are substantially minimized, as discussed further below with reference to FIG. 6. Concurrently, the voltage signal intensity will vary at twice the modulation frequency. Either or both of these detectable effects are usable to evaluate external cavity loss associated with loss characteristics associated with the positioning or inter-relationship of end mirror 14, grid generator 34 and channel selector 36, and to generate error signals usable for adjustment of cavity loss characteristics such that the modulation signal and intensity signal are optimized.

FIG. 5A illustrates the control system for the external cavity laser 56 of FIG. 4A. In external cavity laser 56, optical path length l is adjusted by voltage control of the effective optical thickness of electro-optic element 58. Path length adjuster 100 provides a "DC" offset, necessary to center external cavity passband PB1 with passbands PB2 and PB3, which is combined with the modulation signal from dither element 102, to provide the appropriate "AC" compensation signal, which is communicated to electro-optical element 58 via interface 62.

FIG. 5B shows the control system for external cavity laser 72, wherein modulation of optical path length l is carried out using electro-optic element 58 and adjustment of optical path length l is carried out via thermal positioning of end mirror 14 by compensating arm 74, as shown in FIG. 4B and described above. In this case, path length adjuster communicates a compensating signal via interface 80 to thermoelectric controller 78, which accordingly heats or cools compensating arm 74 to re-position end mirror 14 to optimize the loss profile of the external cavity. The external cavity laser system 82 of FIG. 3 may utilize either of the control systems of FIG. 5A and FIG. 5B.

Figure 6:
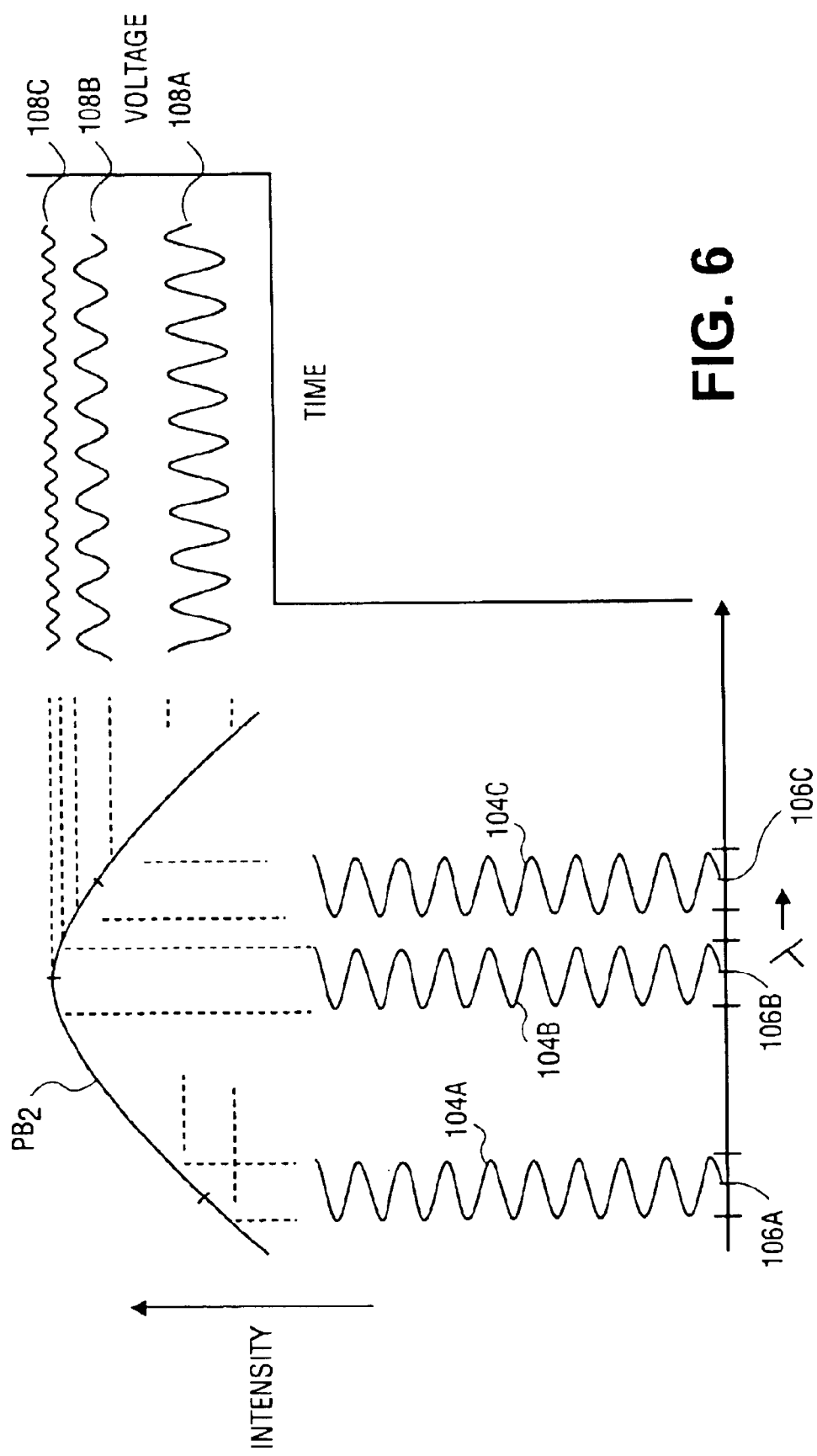
FIG. 6 is a graphical illustration of the error signals derived from frequency dither of a loss element.

Referring now to FIG. 6, the relationship of the dither modulation signal introduced to an external cavity with respect to the detected voltage modulation across gain medium 12 is illustrated graphically as wavelength versus relative intensity. FIG. 2 shows a grid etalon passband PB2, together with frequency or dither modulation signals 104A, 104B, 104C corresponding to external cavity laser modes 106A, 106B and 106C respectively. Frequency modulation signals 104A–C are introduced to the laser external cavity by voltage modulation of electro-optic element 58 in the manner described above. As shown in FIG. 6, laser mode 106A is off-center with respect to the center of passband PB2 towards the shorter wavelength side of passband PB2, while laser mode 106B is located at about the center wavelength of passband PB2, and laser mode 106C is located on the longer wavelength side of passband PB2. Laser mode wavelength 106B corresponds to a wavelength lock position and represents an optimal loss profile for the external cavity. Laser modes 106A and 106B are off-center with respect to passband PB2 and result in non-optimal cavity loss profiles which will require adjustment of the external cavity length l, either by adjusting the effective optical thickness of electro-optic element 58 or by positioning end mirror 14 as described above.

The voltage detected across gain medium 12 by voltage sensor 32 for dither signals 104A, 104B and 104C are shown respectively as voltage modulation signals 108A, 108B and 108C on the right side of FIG. 6, which correspond respectively to the laser mode wavelengths 106A, 106B and 106C. The location of laser mode 106A at a wavelength shorter than that of the center wavelength of passband PB2 results in voltage signal 108A having a modulation that is in phase with the dither modulation signal 104A. The location of laser mode 106C at a greater wavelength than the center wavelength of passband PB2 results in a modulation of voltage signal 108C that is out of phase with respect to the modulation of dither signal 104C.

The location of each laser mode wavelength with respect to the slope of passband PB2 affects the amplitude of the corresponding voltage signal. Thus, voltage signal 108A, which corresponds to laser mode 106A wavelength on a relatively steep slope of passband PB2, has a relatively large modulation amplitude, while voltage signal 108C, which corresponds to laser mode 106C associated with a portion of passband PB2 having a less steep slope, has a correspondingly smaller modulation amplitude. Voltage signal 108B, which corresponds to centered laser mode 106B, has a minimal modulation amplitude since the period of the dither modulation signal 104B occurs symmetrically about the center wavelength of passband PB2. The frequency of the dominant intensity in the case of voltage signal 108B in this instance is twice the frequency of dither modulation signal 104B.

From FIG. 6 it can be seen that the amplitude of the modulation detected in the voltage across gain medium 12 indicates the magnitude of correction or adjustment required for the laser external cavity, while the phase of voltage signal modulation indicates the direction of the adjustment. The amplitude of dither modulation signals 104A–C is selected so that, during wavelength lock, the variation in the intensity of voltage signal modulation is held to acceptable levels for the particular use of the external cavity laser. The frequency of the dither modulation is chosen to be high enough to provide coherence control, but low enough to prevent interference with information modulated onto the carrier signal provided by the external cavity laser during transmission.

Figure 7:
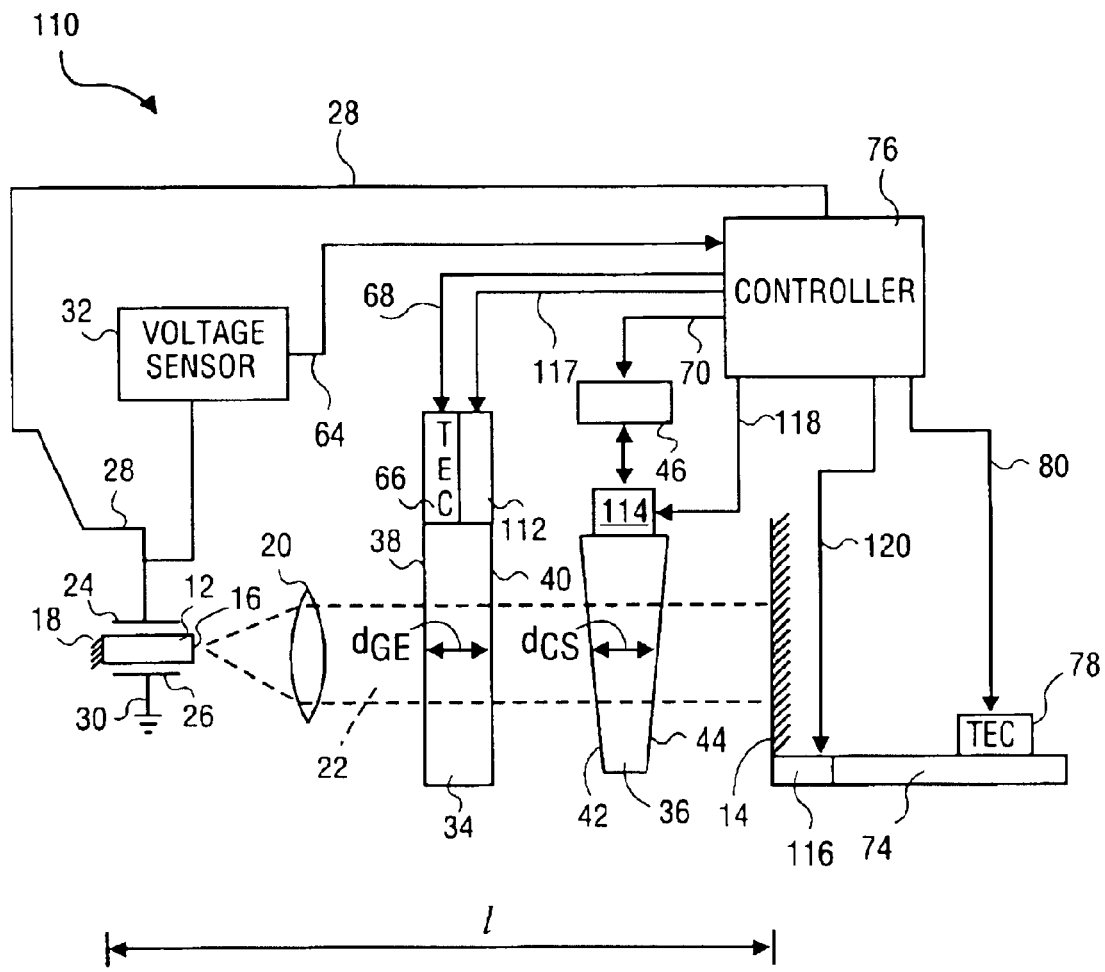
FIG. 7 is a schematic diagram of an external cavity laser apparatus utilizing multiple dither elements to introduce frequency modulation into multiple loss elements, with loss characteristics detected as voltage modulation across the gain medium.

The invention may be used to evaluate and adjust loss characteristics associated with multiple loss elements in an external cavity laser. Referring to FIG. 7, there is shown an external cavity laser apparatus 110 wherein like reference numerals are used to denote like parts. In the apparatus 110, a separate frequency modulation or dither element is used with each of several loss elements. Thus, a dither element 112 is coupled to grid etalon 34, while dither element 114 is coupled to channel selector 36, and dither element 116 is coupled to end mirror 14. Dither elements 112, 114, 116 may comprise, for example, conventional mechanical, piezoelectric, electro-optic or acousto-optic oscillators or like oscillator devices which can respectively introduce a frequency modulation signal into the tilt of the grid etalon 34, the transverse position of channel selector 36 and axial position of end mirror 14. Dither elements 112, 114 and 116 each are operatively coupled to controller 76 via communication interfaces 117, 118 and 120 respectively. Additional dither elements may be used in association with additional loss elements (not shown) present in or otherwise associated with external cavity laser apparatus 110.

Introduction of a modulation signal to end mirror 14 by dither element 116 directly modulates the optical path length l of the external cavity defined by end mirror and output face 18 in the same manner provided by electro-optic element 58 in FIGS. 4A–4C described above. This results in a modulation in the voltage across gain medium 12 that is detectable by voltage sensor 32 and which can be used to adjust the optical path length l of the external cavity by positioning end mirror 14 via heating or cooling of compensation arm 74 with thermal electric controller 78, as also described above.

The introduction of a modulation signal to grid etalon 34 by frequency dither 112 results in modulation of the optical path length $d_{GE}$ between faces 38, 40 of grid etalon 34. When modulating grid etalon 34, the end mirror 14 is not modulated by element 116 except as described below. The modulation of the optical path length within the grid etalon 34 modulates the transmission passbands of the grid etalon 34. Because the FSR of the grid etalon 34 is larger than the FSR of the laser cavity modes, a given modulation of the optical path length produces corresponding larger modulation in wavelength of the etalon transmission modes than a similar optical path length modulation of the cavity length to produce modulation of wavelength of the laser modes.

This modulation of the grid etalon 34 can be used to servo lock the cavity length using a method similar to that described in FIG. 6, except that in this case the laser frequency is nominally fixed and the grid etalon passband is modulated. The oscillation of the etalon passband modulates the feedback into the gain medium 12 that results in a voltage modulation across the gain medium 12 detected by voltage sensor 32. An error signal derived by controller 76 from the modulation of the voltage across gain medium 12 thus can be used to adjust the cavity length in the manner described above.

Modulation of the optical path length of grid etalon 34 also modulates the cavity length of laser 110, and thus produces a small wavelength modulation. In some applications it is desirable to have little or no wavelength modulation of the laser signal. To cancel out the wavelength modulation, dither element 116 may be used to drive the end mirror 14 with a corresponding opposite phase with respect to dither element 112 and an amplitude appropriate for achieving minimum net cavity length modulation and a correspondingly minimum lasing wavelength modulation.

Providing a modulation signal to channel selector 36 results in modulation of the optical path length $d_{CS}$ between faces 42, 44 of channel selector 36. The modulation of the transmission through the channel selector 36 modulates the feedback into the laser gain medium 12, which modulates the voltage across the gain medium 12 detected by sensor 32. Error signals are derived from the detected voltage modulation by a method similar to that described in FIG. 6 except that, again, the laser wavelength is fixed and the transmission passband is being modulated. This error signal is used to generate compensating signals by controller 76, which are used to positionally adjust channel selector 36 with drive element 46 in the manner described above.

In one embodiment, the use of modulation signals in connection with each of the loss elements 34, 36 of FIG. 7 may be carried out sequentially. In this situation, controller 76 sequentially dithers grid generator 34 and channel selector 36. While the grid etalon 34 is dithered, voltage modulation across the gain medium is measured and the resulting error signals are used to adjust cavity length. While channel selector 36 is dithered, the sensed voltage modulation across gain medium 12 is used to adjust optical path length $d_{CS}$ by repositioning channel selector 36 with respect to the beam traveling optical path 22. The above operations may be continually repeated during laser operation to ensure optimal loss characteristics for each loss element and an optimal loss profile for external cavity laser 110 during operation.

In another embodiment, dither modulations may be simultaneously introduced into grid etalon 34 and channel selector 36 by dither elements 112, 114 respectively, wherein the dither modulations provided by elements 112, 114, 116 are made at different, non-interfering frequencies. Thus, the frequency modulation of each of the loss elements 34, 36 results in simultaneous modulation of the voltage across gain medium 12 at different, non-interfering frequencies, which are simultaneously detectable by voltage sensor 32. This arrangement allows simultaneous in-situ adjustment of optical path length $d_{GE}$, optical path length $d_{CS}$ according to error signals derived from the different, non-interfering frequency modulations detected across gain medium 12.

Once again, it should be noted that grid etalon 34, channel selector 36 and end mirror 14 represent only a few of the loss elements that may be present in an external cavity laser and which may have loss characteristics that are adjustable according to detected voltage modulation across gain medium 12. Losses associated with lens 20, tilts of end mirror 14, or other optical components (not shown), will have loss characteristics that can be adjusted using voltage modulation across the gain medium in accordance with the invention.

Figure 8:
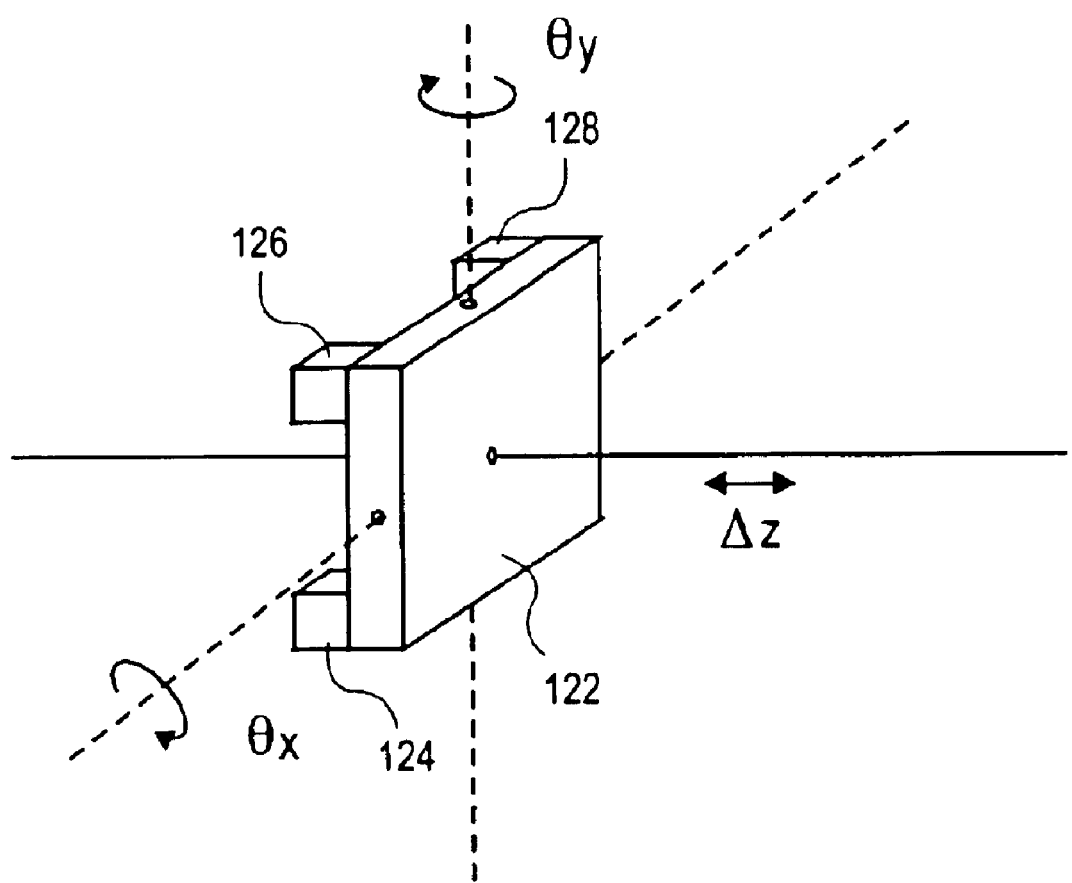
FIG. 8 is a schematic illustration of the use of multiple dither elements in association with multiple degrees of positional freedom of a loss element.

Referring now to FIG. 8, there is shown a loss element 122 with multiple dither elements 124, 126, 128 coupled to loss element 122 in a configuration that allows the introduction of a dither modulation to multiple positional degrees of freedom of loss element 122. The loss element 122 may be, for example, a laser end mirror used in an alignment fixture for manufacturing the laser or as the end mirror for operation. The multiple degrees of positional freedom each may have a frequency modulation introduced by dither elements 124, 126, 128, with each degree of positional freedom adjustable according to error signals derived from voltage modulation detected across the gain medium. The dither elements may be piezoelectric elements, micromechanical elements or another positional actuator. Loss element 122 is shown with positional degrees of freedom $\delta z$ (translation along the z axis), $\theta x$ (rotation around the x axis) and $\theta y$ (rotation around the y axis). Each of these positional degrees of freedom affect the loss characteristics of loss element 122, and can be adjusted by translational and rotational adjustment elements 124, 126, 128 configured to adjust the $\delta z$, $\theta x$ and $\theta y$ of loss element 122 according to monitored voltage modulation in the manner described above.

The dithering and adjustment of each positional degree of freedom of loss element 122 may be carried out sequentially, or simultaneously using different non-interfering frequency modulations as described above. Where multiple loss elements 122 are present in a laser cavity (not shown), the dithering of each positional degree of freedom for each loss element 122 may be carried out simultaneously or sequentially.

Figure 9:
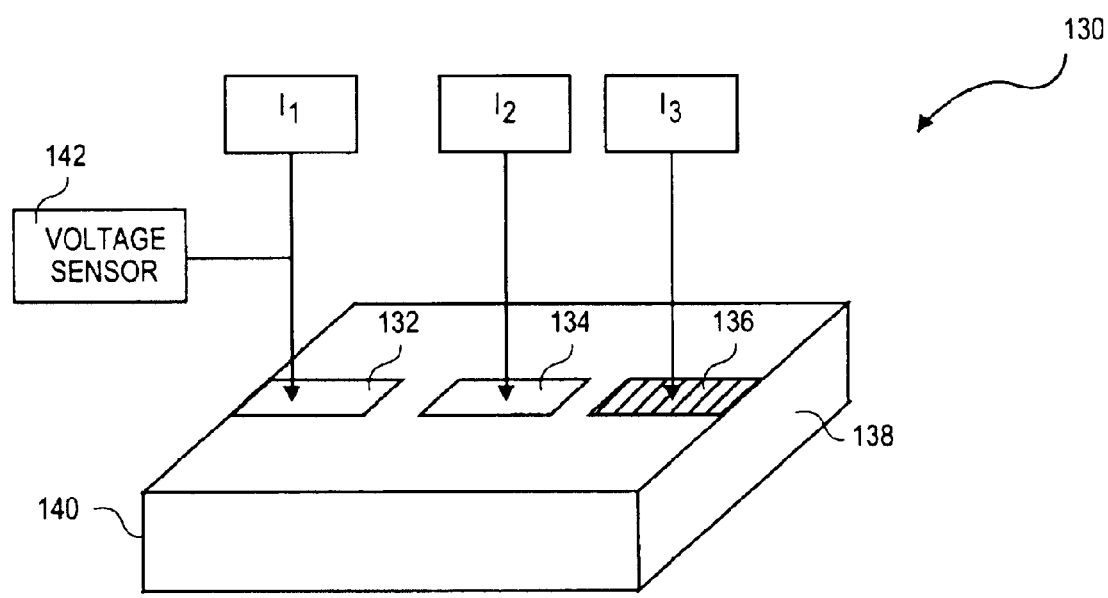
FIG. 9 is a schematic illustration of a distributed Bragg reflector (DBR) laser apparatus with monitoring of voltage across a gain medium used to evaluate cavity loss.

Referring next to FIG. 9, there is shown a solid state laser apparatus 130 that employs monitoring of voltage across a gain region to evaluate and correct losses in accordance with the invention. Laser 130 is shown configured as an integrated, single chip distributed Bragg reflector (DBR) device having a gain region 132, a phase control region 134, and a Bragg grating or reflector region 136. Laser 130 includes facets 138, 140 which define a laser cavity. Gain region 132 is operatively coupled to a first current source $I_1$, while phase control region 134 is operatively coupled to a second current source $I_2$, and Bragg reflector 136 is operatively coupled to a third current source $I_3$. In operation, gain region 132 is pumped with a drive current from current source $I_1$. Phase control region 134 is controlled by current from current source $I_2$ to adjust the round trip optical path length of the cavity. Bragg reflector 136 serves a tuning element or channel selector and is adjusted by selective application of current from current source $I_3$ to change the effective grating pitch. Laser 130 is configured to deliver optical output from facet 140. The fabrication and operation of DBR lasers of this sort is well known in the art. A power splitter and an additional phase control region and Bragg reflector region (not shown) may be incorporated to enhance the tuning range through the Vernier effect.

These additions, and other additional loss elements, may be controlled using the same techniques described herein for the loss elements shown in FIG. 9.

The Bragg reflector region 136 of DFB laser 130 is a loss element associated with the laser cavity defined by facets 138, 140. In this regard, DFB laser 130 is similar to the external cavity lasers described above, but with intra-cavity loss elements present as integral portions of a solid state laser. The distributed Bragg reflector provides wavelength selective feedback into gain region 132. A small AC current modulation added to the DC level of current source $I_3$ modulates the passband of the wavelength filtering element 136. This passband modulation modulates the feedback into the gain region 132 and produces a voltage modulation on sensor 142. The voltage modulation is used by a control element (not shown) to adjust the DC level of current source $I_3$.

The AC modulation added to $I_3$ may also produce a small modulation of cavity length that will appear as a wavelength modulation of the laser output, which may be canceled by adding a compensatory current modulation to current source $I_2$ to generate an equal and opposite path length modulation. The DC levels for current sources $I_1$ and $I_2$ can be set using a control element (not shown) based on signals from a monitor photodiode and wavelength locker respectively (also not shown). The control element may also monitor signals on the wavelength locker at the frequency of the applied voltage added to current source $I_3$ and compute an error signal usable to set the magnitude and phase of the AC signal added to current source $I_2$ that compensates for wavelength modulation of the laser.

In the use of the invention, a situation may arise where modulation of a loss element creates an undesirable side effect such as, for example, unwanted wavelength or amplitude modulations where no method is available to continuously eliminate these effects. In these situations, the dither of loss elements can be implemented in short bursts. Error signals are generated by the controller during these bursts. The bursts may be further synchronized with other system events, such as periods where data is not transmitted.

Figure 10:
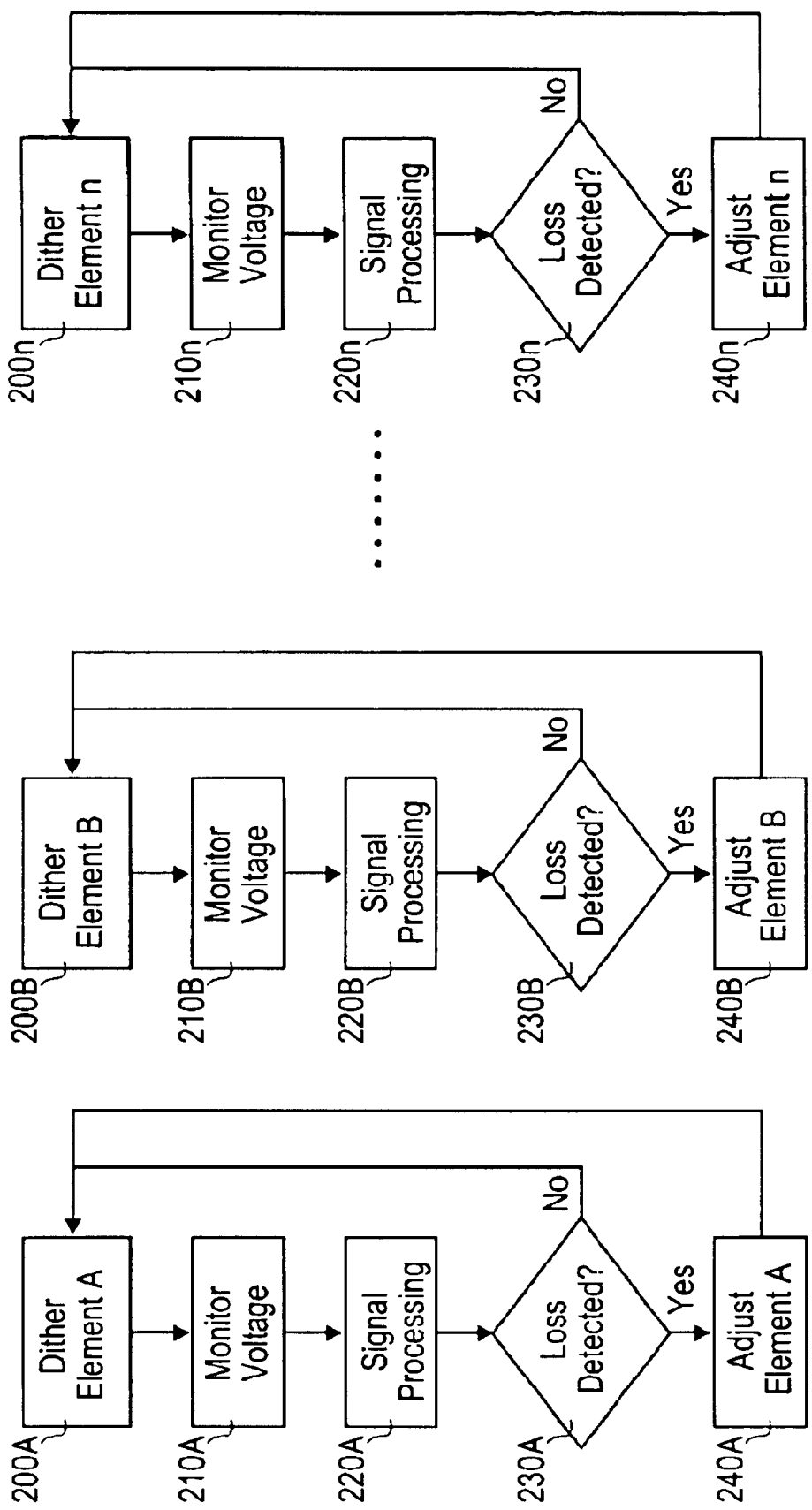
FIG. 10 is a flow chart illustrating a method of operation of an external cavity laser.

The method of the invention will be more fully understood by reference to FIG. 10, as well as FIG. 7 through FIG. 9. The flow chart of FIG. 10 illustrates various events that occur during laser operation in accordance with the invention. At event 200A, a first loss element A is dithered or frequency modulated. The loss element A may comprise, for example, end reflector 14, channel selector 36, grid etalon 34 as shown in FIG. 7, or phase control region 134 or Bragg reflector 136 as shown in FIG. 9, or any other intra-cavity loss element. The dithering of element A in event 200A may comprise individual dithering of each degree of positional freedom, $\delta z$ (translation along the z axis), $\theta x$ (rotation around the x axis) and $\theta y$ (rotation around the y axis) for loss element A, which may occur simultaneously or sequentially as shown in FIG. 8 and described above.

While loss element A is dithered, voltage across gain medium or region is monitored at event 210A by a voltage sensor positioned in association with the gain medium. The dither or frequency modulation introduced to loss element A is detectable as voltage modulation across the gain medium, as noted above. The amplitude and phase of the voltage modulation are indicative of the loss characteristics of loss element A as shown in FIG. 6 and described above.

At event 220A, signal processing is carried out to develop or derive an error signal from the voltage monitored in event 210A. The signal processing may be carried out via Fourier transformation by signal processing element 94 in controller 60 or 72 as shown in FIGS. 5A and 5B and described above. The error signal will reflect the loss characteristics of loss element A according to the amplitude and/or phase of voltage modulation detected across the laser gain medium, and will indicate any needed correctional adjustment of the loss element A.

At event 230A, a determination is made as to whether an optical loss is detected in association with loss element A. Determination of loss characteristics of a loss element is made according to the amplitude and/or phase of voltage modulation detected across the laser gain medium as noted above. If the detected voltage modulation exhibits optimal amplitude and/or phase characteristics, no loss is detected, and events 200A through 230A may be repeated. If the detected voltage modulation indicates a non-optimal amplitude and/or phase characteristic, event 240A is carried out. Stated another way, event 230A provides an error signal for event 240A that completes a closed loop control loop of the loss element.

At event 240A, an adjustment is made to loss element A to zero or null out the error signal that indicated the presence of a loss associated with element A. The nature of the adjustment will vary depending upon the type of loss element and loss characteristic. The adjustment may comprise, for example, a linear and/or rotational actuation of loss element A along one or more positional degrees of freedom. The adjustment may alternatively comprise a temperature or voltage adjustment to loss element. Where loss element A is, for example, an end reflector 14 as shown in FIG. 7, the adjustment in event 240A may comprise thermal positioning of reflector 14 via heating or cooling of compensating element 74 in the manner described above. In some embodiments, the dithering and adjustment of a loss element may be provided by the same actuator, while in other embodiments the dithering and adjustment of a loss element are provided by different actuators.

At event 200B, a dither or frequency modulation is applied to a second loss element B. Event 200B may occur after event 240A, or may occur simultaneously with events 200A–240A described above. Once again, loss element B may comprise any loss element associated with a laser cavity, and the dithering of element B in event 200B may comprise simultaneous or sequential dithering of each degree of positional freedom, $\delta z$, $\theta x$ and $\theta y$.

As loss element B is dithered, voltage across gain medium or region is monitored at event 210B by a voltage sensor positioned in association with the laser gain medium as described above. The dither or frequency modulation introduced to loss element B appears as voltage modulation across the gain medium, and the amplitude and phase characteristics of the modulation indicate the loss characteristics of loss element B.

At event 220B, signal processing is carried out to develop or derive an error signal from the voltage monitored in event 210B. If element B is being modulated simultaneously to element A but at a distinct frequency, then a Fourier transform at the distinct frequency will provide a distinct error signal. The error signal indicates the loss characteristics of loss element B and indicates any needed correctional adjustment for loss element B.

At event 230B, a query or determination is made as to whether a loss is detected for loss element B according to the amplitude and/or phase of voltage modulation detected across the laser gain medium. If no loss is detected, events 200A through 230A may be repeated, and if a loss is detected, event 240B is carried out wherein an adjustment is made to loss element B to zero or null out the error signal which indicated the presence of a loss associated with element B. The events 200B–240B may occur simultaneously with the events 200A–240A, or subsequent to event 240A. The use of different dither frequencies in association with loss elements A and B allows simultaneously monitoring of amplitude and phase variations associated with the different frequency modulations, and allows simultaneous evaluation of loss characteristics and adjustment of loss elements as described above.

Events 200n through 240n are generally the same as described above in events 200A–240A and 200B–240B, but are carried out for an nth loss element associated with a laser cavity. Once again, it is noted that events 200n through 240n may be carried out simultaneously with 200A–240A and 200B–240B by use of non-interfering dither frequencies for each loss element A, B, . . . n, or in a sequential manner as described above. The various events associated with dither elements A, B, . . . n may be carried out with a mixture of simultaneous and sequential dithers. Simultaneous dithering of elements may occur in "bursts" during limited time slices and sequenced with other events.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A method, comprising:
   exciting a gain medium having an active region to generate an optical beam along an optical path;
   feeding back a portion of the optical beam as a feedback optical beam to the active region;
   dithering an operating setting of an optical element positioned in the optical path about a nominal value of the operating setting to generate a wavelength dither of the feedback optical beam, the wavelength dither of the feedback optical beam to induce a voltage modulation across the active region of the gain medium;
   sensing the voltage modulation across the active region of the gain medium;
   generating an error signal in response to the sensed voltage modulation; and
   adjusting the nominal value of the operating setting of the optical element in response to the error signal to tune the optical element.

2. The method of claim 1 wherein the gain medium comprises a semiconductor gain medium.

3. The method of claim 2 wherein deviating the nominal operating setting of the optical element includes deviating a nominal operating position of the optical element.

4. The method of claim 2 wherein dithering the nominal value of the operating setting of the optical element includes dithering a nominal index of refraction of the optical element.

5. The method of claim 2 wherein dithering the nominal value of the operating setting of the optical element includes dithering a nominal voltage applied to the optical element.

6. The method of claim 2 wherein dithering the nominal value of the operating setting of the optical element includes dithering a nominal temperature of the optical element.

7. The method of claim 2 wherein the optical element is one of an end mirror of the cavity, a grid generator, and a channel selector.

8. The method of claim 2 wherein adjusting the nominal value of the operating setting includes adjusting the nominal value of the operating setting to reduce a voltage sensed across the gain medium.

9. The method of claim 1, further comprising;
   dithering a plurality of nominal values of the operating settings of a corresponding plurality of optical elements of the cavity to induce the voltage modulation across the gain medium; and
   adjusting the plurality of nominal values of the operating settings of the corresponding plurality of optical elements in response to the sensed voltage to tune the plurality of optical elements.

10. The method of claim 9, wherein the plurality of nominal values of the operating settings are dithered and adjusted sequentially.

11. The method of claim 9 wherein the plurality of nominal values of the operating settings are dithered and adjusted simultaneously.

12. A laser apparatus, comprising:
   a gain medium having an active region to emit an optical beam along an optical path;
   first and second reflectors positioned in the optical path and defining a laser cavity, the first reflector to reflect a portion of the optical beam as a feedback optical beam to the active region;
   a voltage sensor operatively coupled to the gain medium to monitor voltage across the active region;
   an optical element positioned in the optical path to induce a wavelength dither in the feedback optical beam, the wavelength dither of the feedback optical beam to induce a voltage modulation across the active region; and
   a control system operatively coupled to the voltage sensor and to the optical element, the control system to dither an operating setting of the optical element about a nominal value of the operating setting to induce the wavelength dither, the control system further to adjust the nominal value of the operating setting in response to the voltage modulation to tune the optical element.

13. The laser apparatus of claim 12 wherein the control system comprises:
   a dither element to dither the operating setting of the optical element; and
   an adjustment element to adjust the nominal value of the operating setting of the optical element.

14. The laser apparatus of claim 12, further comprising:
   a plurality of optical elements positioned in the optical path having a corresponding plurality of operating settings, the control system operatively coupled to each of the plurality of optical elements to dither the corresponding plurality of operating settings about nominal values to induce the voltage modulation across the gain medium and to adjust the nominal values of the plurality of operating settings in response to the voltage modulation to tune the plurality of optical elements.

15. A The laser apparatus of claim 14 wherein the control system to dither and to adjust the nominal values of the plurality of operating settings sequentially.

16. The laser apparatus of claim 14, wherein the control system to dither and to adjust the nominal values of the plurality of operating settings simultaneously.

17. The laser apparatus of claim 12, wherein the optical element comprises the first reflector.

18. The laser apparatus of claim 12 wherein the optical element comprises one of a grid generator, a channel selector, and an electro-optic tuning element.

19. The laser apparatus of claim 12 wherein the nominal value of the operating setting includes one of a nominal operating position of the optical element, a nominal voltage applied to the optical element, and a nominal temperature of the optical element.

20. The laser apparatus of claim 12 wherein the second reflector comprises a partially reflective facet formed on the gain medium.

21. An apparatus, comprising:
   means for generating an optical beam along an optical path;
   means for feeding back a portion of the optical beam as a feedback optical beam to the means for generating;
   means for dithering an operating setting of an optical element positioned in the optical path about a nominal value of the operating setting to generate a wavelength dither of the feedback optical beam, the wavelength dither of the feedback optical beam to induce a voltage change across the means for generating;
   means for sensing the voltage change across the means for generating the optical beam;

means for generating an error signal in response to the sensed voltage change; and means for adjusting the nominal value of the operating setting of the optical element in response to the error signal to tune the optical element.

22. The apparatus of claim 21 wherein the means for dithering the operating setting about the nominal value comprises a means for dithering a nominal operating position of the optical element to generate the wavelength dither of the feedback optical beam, the optical element comprising an end reflector for feeding back the feedback optical beam.

23. The apparatus of claim 21 wherein the means for dithering the operating setting comprises a means for dithering an index of refraction of the optical element about a nominal index of refraction to generate the wavelength dither of the feedback optical beam.

24. The apparatus of claim 23 wherein the means for dithering the index of refraction of the optical element comprises a means for dithering a voltage applied across the optical element.

25. The apparatus of claim 23 wherein the means for dithering the index of refraction of the optical element comprises a means for dithering a temperature of the optical element.

* * * * *